United States Patent
Furtek

(12) 
(10) Patent No.: US 6,820,068 B1
(45) Date of Patent: Nov. 16, 2004

(54) SYSTEM AND METHOD FOR VERIFYING LOGICAL, ARITHMETIC AND TIMING DEPENDENCIES OF SYSTEM BEHAVIORS USING CONSTRAINT CALCULUS ANALYSIS

(75) Inventor: Frederick C. Furtek, Menlo Park, CA (US)

(73) Assignee: Furtek, Menlo Park, CA (US)

( * ) Notice: Subject to any disclaimer, the term of this patent is extended or adjusted under 35 U.S.C. 154(b) by 667 days.

(21) Appl. No.: 09/668,763

(22) Filed: Sep. 22, 2000

(51) Int. Cl.[7] ................................................. G06N 5/00
(52) U.S. Cl. ........................................... 706/45; 716/13
(58) Field of Search ............................. 706/45; 716/14, 716/13

(56) References Cited

U.S. PATENT DOCUMENTS

| | | | |
|---|---|---|---|
| 5,729,466 A | 3/1998 | Bamji | |
| 5,971,596 A | 10/1999 | Nishikawa | |
| 6,086,631 A | 7/2000 | Chaudhary et al. | |
| 6,477,693 B1 * | 11/2002 | Marchenko et al. | 716/14 |
| 6,543,043 B1 * | 4/2003 | Wang et al. | 716/14 |
| 6,564,366 B1 * | 5/2003 | Marchenko et al. | 716/14 |

OTHER PUBLICATIONS

Massimo Bombana, et al., "Design–Flow and Synthesis for ASICs: a case study," IEEE, Jun. 12, 1995, XP 000546342, pp. 292–297.

Corrie Huijs, "Design Correctness of Digital Systems," IEEE, Aug. 25, 1998, XP 010298054, pp. 30–33.

Corrie Huijs, "A Graph Rewriting Approach for Transformational Design of Digital Systems," IEEE, 1996, pp. 177–184.

* cited by examiner

Primary Examiner—Wilbert L. Starks, Jr.

(57) ABSTRACT

An apparatus and method for verifying system behavior using behavior-constraint-calculus analysis is disclosed. The apparatus accepts a first "known" constraint graph and a second "conjectured" constraint graph. The apparatus transforms the second graph in such a way that the resultant "verified" graph "accepts" only those paths that are implied by the first graph and appear in the second graph.

19 Claims, 16 Drawing Sheets

SYSTEM AND METHOD FOR VERIFYING LOGICAL, ARITHMETIC AND TIMING DEPENDENCIES OF SYSTEM BEHAVIORS USING CONSTRAINT CALCULUS ANALYSIS

BACKGROUND OF THE INVENTION

1. Field of the Invention

This invention pertains generally to system verification. More particularly, the invention is a system and method for verifying system behaviors using constraint-calculus analysis.

2. The Prior Art

Digital (discrete-time) systems are well known in the art. In general, the design and verification of digital systems involve the complex interrelationship among logical, arithmetic and timing dependencies in the system. In particular, the input and output dependencies of such systems are of special interest.

The current methods for verifying discrete-time systems include simulation, emulation, debugging and formal verification. Simulation verification is a software solution wherein a software algorithm is programmed to carry out the functions of the discrete-time system. Using the simulation software, a user is able to construct a software version of the digital system under consideration. The simulation software normally provides an output signal, typically in the form of a graphical waveform. Upon providing the input to the simulator, the user is able to observe the output from the waveform signal produced by the simulator.

Emulation is a hardware solution for verifying the designs of digital systems. Emulation commonly involves the use of FPGA (Field-Programmable Gate Array) devices, a type of logic chip that can be programmed. An FPGA is capable of supporting thousands of gates. A programmer user is able to set the potential connections between the logic gates of the FPGA. Using FPGA devices, the user is able to prototype the digital system under consideration for verifying the input/output dependencies of the system.

Debugging generally involves manually implementing and running the system design. If any problems result during execution, the user reverts to a previous step of the design process to ascertain the source of the problem. Once the user has made the necessary changes to the system design, the user again attempts to execute the system design to ascertain if there are any additional problems, and the process is repeated again.

There are several disadvantages associated with these present verification techniques. First, simulation, emulation and debugging methods are not exhaustive. That is, these prior-art methods are, in general, not capable of completely verifying that a system design meets the behavioral requirements that are expected of it. Second, while the above methods provide the user with input and output dependencies, the above methods fail to provide the reason a particular output is produced by a particular input, thereby inhibiting a straightforward determination of the cause of an anomalous output.

Yet another method for verifying system behavior is formal verification. Formal verification involves modeling the system under consideration as a finite-state machine. A finite-state machine includes a set of possible states with defined transitions from state to state. However, present methods of formal verification have a limited ability to handle logical, arithmetic, and timing dependencies, which are often intertwined. For example, a complete functional specification of many digital-signal-processing functions—such as infinite-impulse-response filters—involves all three types of dependencies.

Another drawback with finite-state machines is that the more complex the system or the data in the system, the more complex becomes the finite-state machine to model the system. For example, 10-bit systems would require a thousand (1,024) states, and 20-bit systems would require a million (1,048,576) states. Such complex systems result in cumbersome state-machine methods for formal verification.

Accordingly, there is a need for a system and method for verifying system behaviors which provides for comprehensive system behavior without relying upon cumbersome state-machine modeling. The present invention satisfies these needs, as well as others, and generally overcomes the deficiencies found in the background art.

An object of the invention is to provide a system and method for verifying system behaviors which overcomes the deficiencies of the prior art.

Another object of the invention is to provide a system and method for verifying system behaviors using constraint-calculus analysis.

Further objects and advantages of the invention will be brought out in the following portions of the specification, wherein the detailed description is for the purpose of fully disclosing the preferred embodiment of the invention without placing limitations thereon.

BRIEF DESCRIPTION OF THE INVENTION

The present invention is a system and method for verifying system behaviors (such as the behavior of discrete-time systems, for example) using behavior-constraint-calculus analysis. The invention may be used in such application areas as electronics, digital logic, signal processing, protocols, hardware/software codesign, computer security, mechanical engineering, biology, economics and finance, among others.

In the present invention, system behaviors are defined as a sequence of states which are either allowed (permitted/possible) or disallowed (prohibited/impossible). Behavioral constraints are defined as the product (conjunction) of Boolean formulas distributed over time which are satisfied only by disallowed behaviors. As opposed to finite-state machines which indicate possible or allowed behavior such as possible state sequences, behavioral constraints indicate what cannot happen (i.e., disallowed behavior).

There are three principal advantages to dealing with disallowed patterns of behavior: (1) many complex logical, arithmetic and timing dependencies are more conveniently/succinctly expressed in terms of disallowed behaviors, (2) the state-space explosion of conventional state-machine approaches is largely avoided and (3) there are powerful verification methods that are suited only to disallowed patterns of behavior.

The present invention may be used to verify a portion of the system or the entire system in general. A user of the system first generates a constraint graph based on a specification defining the system under test. Alternatively, a software application may be used in conjunction with the present invention to generate the constraint graph used by the invention as described herein from a specification in some other format.

Constraint theory and analysis is described in the following articles by the applicant which are incorporated herein by reference: THE THEORY OF CONSTRAINTS by Frederick C. Furtek in The Charles Stark Draper Laboratory, Report CSDL-P-1564, published May 4, 1982 and VERIFYING ONGOING BEHAVIOR: A CASE STUDY by Frederick C. Furtek in The Charles Stark Draper Laboratory, Report CSDL-P-1563, published September 1982 and presented at COMPSAC 82, IEEE, Chicago, 8–12 Nov. 1982, pp. 634–639.

In general, the invention accepts a first "known" constraint graph and a second "conjectured" constraint graph. The invention transforms the second graph in such a way that the resultant "verified" graph "accepts" only those paths that are implied by the first graph and appear in the second graph. It will be appreciated that while the present illustrative embodiment describes the invention receiving input in the form of constraint graphs, the invention may also receive other input signals such as "regular" expressions ([P][~Q] for "Prohibited: P followed by NOT Q in the next state", for example) which may be converted to constraint graphs and processed as described herein.

By way of example and not of limitation, the constraint graphs of the present invention will be represented using conventional finite-state acceptor graphs. More particularly, each constraint graph includes a set of initial nodes (nodes with no incoming arcs), a set of terminal nodes (nodes with no outgoing arcs), and zero or more internal or intermediary nodes. Arcs labeled with Boolean formulas connect the nodes of the constraint graph. Each constraint graph will have at least one path from an initial node to a terminal node. For example, FIG. 1 depicts a constraint graph 1 according to the present invention. Constraint graph 1 includes initial node 2 and terminal nodes 3a, 3b. Constraint graph 1 further includes internal nodes 4a, 4b. ARC 5 is labeled by the Boolean formula P. Boolean formula P may be true in some states and false in other states. ARC 6 is also labeled by the Boolean formula P. ARCs 7a and 7b are labeled by the Boolean formula Q. ARCs 8a and 8b are labeled by the Boolean formula "NOT Q" (~Q).

A sequence of Boolean formulas is "accepted" by a constraint graph if and only if it is associated with a finite path starting at an initial node and ending at a terminal node. Thus in FIG. 1, the sequence <P,P> is accepted because it is associated with a path—ARCs 5 and 6—starting at an initial node—NODE 2—and ending at a terminal node—NODE 3a. And because the graph of FIG. 1 is interpreted as a "constraint graph", the accepted sequence <P,P> is interpreted as a "constraint". Thus <P,P> represents a disallowed pattern of behavior. According to this constraint, the following behavior is prohibited: "P holding in a state followed by P in the next state". Or put in an alternative form: "If P holds in a state, then ~P must hold in the next state".

The Boolean formulas P and Q in the above example may, in general, represent equalities involving signals of arbitrary data types. For example, if Y and Z are 32-bit floating-point signals, then the Boolean formula $$Z(t)=Y(t-1),$$

expresses the relationship: "the (32-bit floating-point) value of Signal Z at time t equals the (32-bit floating-point) value of Signal Y at time t−1." Expressed as a constraint, this relationship becomes:

$$<Z(t)\neq Y(t-1)>,$$

which is a sequence of Boolean formulas of length one. Moreover, if X is also a 32-bit floating-point signal, then $$Z(t)=X(t-3)+Y(t-1)$$

expresses the relationship: "the value of Signal Z at time t equals the sum of the value of Signal X at time t−3 and the value of Signal Y at time t−1." Expressed as a constraint, this relationship becomes:

$$<Z(t)\neq X(t-3)+Y(t-1)>.$$

Such arithmetic constraints can, of course, be of arbitrary complexity and may be of arbitrary length. For example, if Q is a Boolean signal, then the constraint $$<Q, (Z(t)\neq X(t-3)+Y(t-1))>$$

of length 2 expresses the relationship: "If Q is high in a state, then the value of Signal Z in the next state equals the sum of the value of Signal X three states earlier and the value of Signal Y one state earlier."

As noted above, the system accepts a first known constraint graph and a second conjectured constraint graph from a user. Each of the constraint graphs will have at least one accepting path (from an initial node to a terminal node). The system (via a transforming algorithm) then transforms the accepting path(s) in the second graph to produce a third resultant and verified graph.

In one illustrative embodiment, the transforming algorithm comprises: creating a set of "links" from the first constraint graph; resolving and deleting the links via those signals that are not mentioned in the second conjectured graph; resolving but not deleting links via those signals that are mentioned in the conjectured constraint graph, and "normalizing" the conjectured constraint graph using the generated links.

The present invention further relates to machine readable media on which are stored embodiments of the present invention. It is contemplated that any media suitable for retrieving instructions is within the scope of the present invention. By way of example, such media may take the form of magnetic, optical, or semiconductor media. The invention also relates to data structures that contain embodiments of the present invention, and to the transmission of data structures containing embodiments of the present invention.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Figure 4:
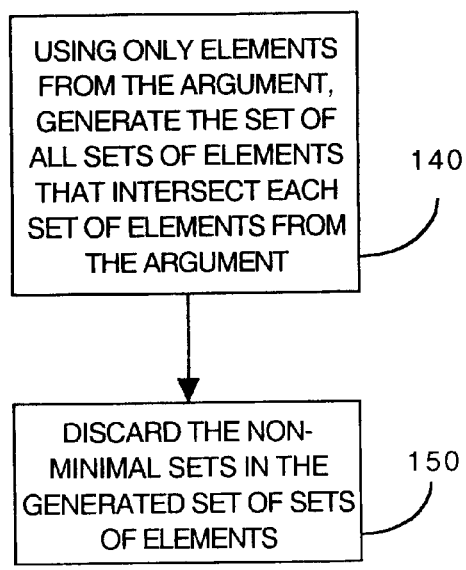
FIG. 4 is a flow chart showing generally acts associated with calculating the "Inverse" of a "sets of sets".
Figure 5:
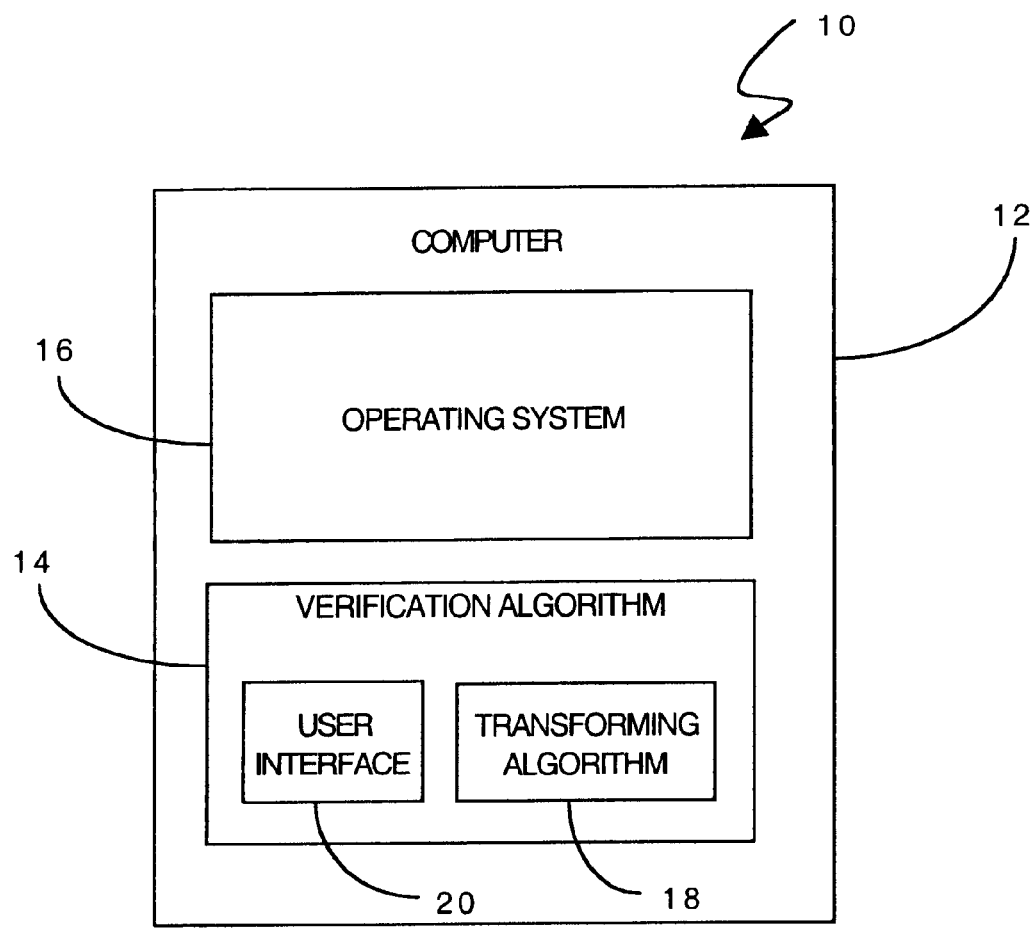
FIG. 5 is a functional block diagram of a verification system in accordance with the present invention.

Referring more specifically to the drawings, for illustrative purposes the present invention is embodied in the apparatus shown in FIG. 5 and the method outlined in FIG. 2 through FIG. 4 and FIG. 6 through FIG. 19. It will be appreciated that the apparatus may vary as to configuration and as to details of the parts, and that the method may vary as to details and the order of the acts, without departing from the basic concepts as disclosed herein. The invention is disclosed generally in terms of a system and method for verifying system behaviors, although numerous other uses for the invention will suggest themselves to persons of ordinary skill in the art.

The invention uses a plurality of data structures including "sets" and "sets of sets". "Sets" and "sets of sets" are generally known in the art. An example of a "set" is:

$\{a, b, c, d\}$ where the elements of the set are a, b, c and d.

An example of a "set of sets" is:

$\{\{a,b\}, \{c,d\}, \{e,f\}\}$ where the elements of the set are sets $\{a,b\}$, $\{c,d\}$ and $\{e,f\}$.

The invention further uses a plurality of functions operating upon "set of sets" arguments including "Sum", "Product", and "Inverse". The "Sum" function receives as its operand two "set of sets" arguments and is described in further detail in conjunction with FIG. 2 below. The "Product" function receives as its operand two "set of sets" arguments and is described in further detail in conjunction with FIG. 3 below. The "Inverse" function receives as its operand one "set of sets" argument and is described in further detail in conjunction with FIG. 4 below.

Figure 2:
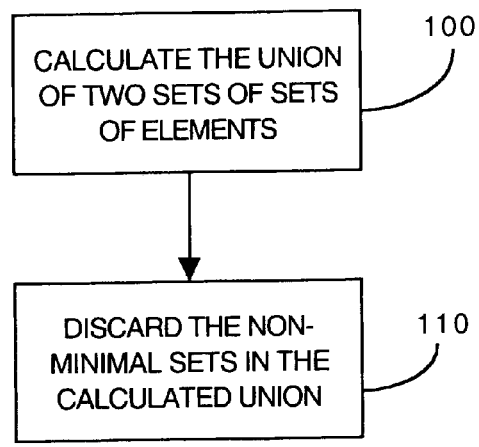
FIG. 2 is a flow chart showing generally the acts associated with calculating the "Sum" of two "sets of sets".

Referring now to FIG. 2, there is generally shown the acts associated with calculating the "Sum" of two "sets of sets". As noted above, the "Sum" function receives as its operand two "set of sets" arguments. For illustrative purposes, suppose the first arguments (ARG 1) is:

$\{\{a,b\}, \{c\}\}$ and the second argument (ARG 2) is:

$\{\{a\}, \{c,d\}\}$.

The Sum ($\{\{a,b\}, \{c\}\}, \{\{a\}, \{c,d\}\}$) is calculated as described herein.

At box 100, the union of the two "set of sets" arguments is calculated. The union is carried out using conventional mathematical set algebra. Thus the union using the above example (ARG 1 and ARG 2) would produce the following set:

$\{\{a,b\}, \{c\}, \{a\}, \{c,d\}\}$.

At box 110, the "non-minimal" sets in the calculated union (from box 100) are discarded. The resulting "set of sets" is the calculated "Sum". "Non-minimal" sets are those sets which include every element of another set. For example, in the "set of sets" $\{\{a,b\}, \{c\}, \{a\}, \{c,d\}\}$, $\{a,b\}$ and $\{c,d\}$ are "non-minimal sets" since $\{a\}$ is included in $\{a,b\}$ and $\{c\}$ is included in $\{c,d\}$. Thus according to the algorithm, non-minimal sets $\{a,b\}$ and $\{c,d\}$ are discarded, and the resulting "set of sets" is:

$\{\{a\}, \{c\}\}$ which is the result of the calculation of Sum ($\{\{a,b\}, \{c\}\}, \{\{a\}, \{c,d\}\}$).

Figure 3:
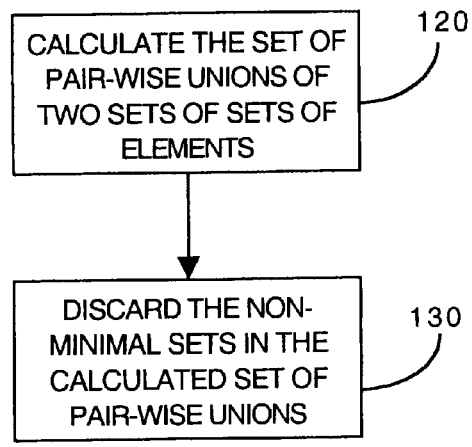
FIG. 3 is a flow chart showing generally the acts associated with calculating the "Product" of two "sets of sets".

Referring next to FIG. 3, there is generally shown the acts associated with calculating the "Product" of two "sets of sets". As noted above, the "Product" function receives as its operand two "set of sets" arguments. Again for illustrative purposes, suppose the first arguments (ARG 1) is $\{\{a,b\}, \{c\}\}$ and the second argument (ARG 2) is:

$\{\{a\}, \{c,d\}\}$.

The Product ($\{\{a,b\}, \{c\}\}, \{\{a\}, \{c,d\}\}$) is calculated as described herein.

At box 120, the "pair-wise unions" of the two "set of sets" arguments are calculated. The pair-wise unions are calculated using conventional mathematical set algebra. The pair-wise union using the above example (ARG 1 and ARG 2) produces the following set:

$\{\{a,b\}, \{a,b,c,d\}, \{a,c\}, \{c,d\}\}$, where $\{a,b\}$ is the union of the pair $\{a,b\}$ and $\{a\}$,
where $\{a,b,c,d\}$ is the union of the pair $\{a,b\}$ and $\{c,d\}$,
where $\{a,c\}$ is the union of the pair $\{c\}$ and $\{a\}$, and
where $\{c,d\}$ is the union of the pair $\{c\}$ and $\{c,d\}$.

At box 130, the "non-minimal" sets in the calculated pair-wise union (from box 120) are discarded. The resulting "set of sets" is the calculated "Product". As described above, "non-minimal" sets are those sets which include every element of another set. In the above calculated "set of sets" {{a,b}, {a,b,c,d}, {a,c}, {c,d}}, {a,b,c,d} is a "non-minimal" set since it includes {a,b} (also because it includes {a,c} and {c,d}). Thus according to the algorithm, non-minimal set {a,b,c,d} is discarded, and the resulting "set of sets" is:

{{a,b}, {a,c}, {c,d}} which is the result of the calculation of Product ({{a,b}, {c}}, {{a}, {c,d}}).

Referring now to FIG. 4, there is generally shown the acts associated with calculating the "Inverse" of a "set of sets". As noted above, the "Inverse" function receives as its operand a single "set of sets" argument. For example, suppose the argument (ARG 3) is the "set of sets":

{{a,b}, {b,c}, {d}}.

The Inverse (also notated as the tilde symbol "~") of ARG 3 is calculated as described herein.

At box 140, the set of all sets that intersect each set of the given operand (ARG 3, for example) is generated (using only elements that appear in the sets of the given operand). Conventional mathematical set algebra is used for determining the intersection of sets. Thus, the set of all sets that intersect each set of {{a,b}, {b,c}, {d}} is:

{{a,b,d}, {a,c,d}, {b,d}, {b,c,d}, {a,b,c,d}}, where {a,b,d} intersects set {a,b} at element a, set {b,c} at element b, and set {d} at element d,
where {a,c,d} intersects set {a,b} at element a, set {b,c} at element c, and set {d} at element d,
where {b,d} intersects set {a,b} at element b, set {b,c} at element b, and set {d} at element d, and
where {b,c,d} intersects set {a,b} at element b, set {b,c} at element c, and set {d} at element d, and
where {a,b,c,d} intersects set {a,b} at element a, set {b,c} at element b, and set {d} at element d.

At box 150, the "non-minimal" sets in the generated set of all sets that intersect each set of the given operand are discarded. The resulting "set of sets" is the calculated "Inverse". As noted above, "non-minimal" sets are those sets which include every element of another set. In the above generated "set of sets" {{a,b,d}, {a,c,d}, {b,d}, {b,c,d}, {a,b,c,d}}, set {a,b,d} is a "non-minimal" set since it includes {b,d}, set {b,c,d} is a "non-minimal" set since it includes {b,d} and set {a,b,c,d} is a "non-minimal" set since it includes {b,d} (as well as {a,b,d}, {a,c,d} and {b,c,d}). Thus according to the algorithm, non-minimal sets {a,b,d}, {b,c,d} and {a,b,c,d} are discarded, and the resulting "set of sets" is:

{{a,c,d}, {b,d}} which is the result of the calculation of Inverse ({{a,b}, {b,c}, {d}}).

FIG. 5 depicts a block diagram of verification system 10 according to the present invention. System 10 comprises a data processing means, such as a computer 12. Computer 12 includes conventional computer components (not shown), including a memory, a processor, a non-volatile storage, input/output interfaces and devices (such as keyboard, mouse, monitor, for example) and other conventional computer components.

Computer 12 further has executing therein a verification algorithm 14 and an operating system 16. The operating system 16 carries out the basic operation of the computer 12 as is known in the art. The verification algorithm (verifier) 14 carries out the verification tasks of the present invention and is described in further detail below in conjunction with FIG. 6 through FIG. 19. Verification algorithm 16 further includes a transforming algorithm 18 which carries out the task of verifying a "conjectured" constraint graph and is described in further detail below in conjunction FIG. 9 through FIG. 19. Additionally, the invention includes a user interface (UI) 20 from which a user accessing the computer may execute the verification algorithm as described herein. The invention may additionally be integrated or interfaced with other software components (not shown) for executing the verification algorithm of the present invention.

In the present illustrative example, the verification algorithm is described as a software application using many of the conventions of the C programming language. However, it will be apparent to those skilled in the art that the present invention may be carried out using other conventional programming languages without departing from the scope and spirit of the invention.

Figure 6:
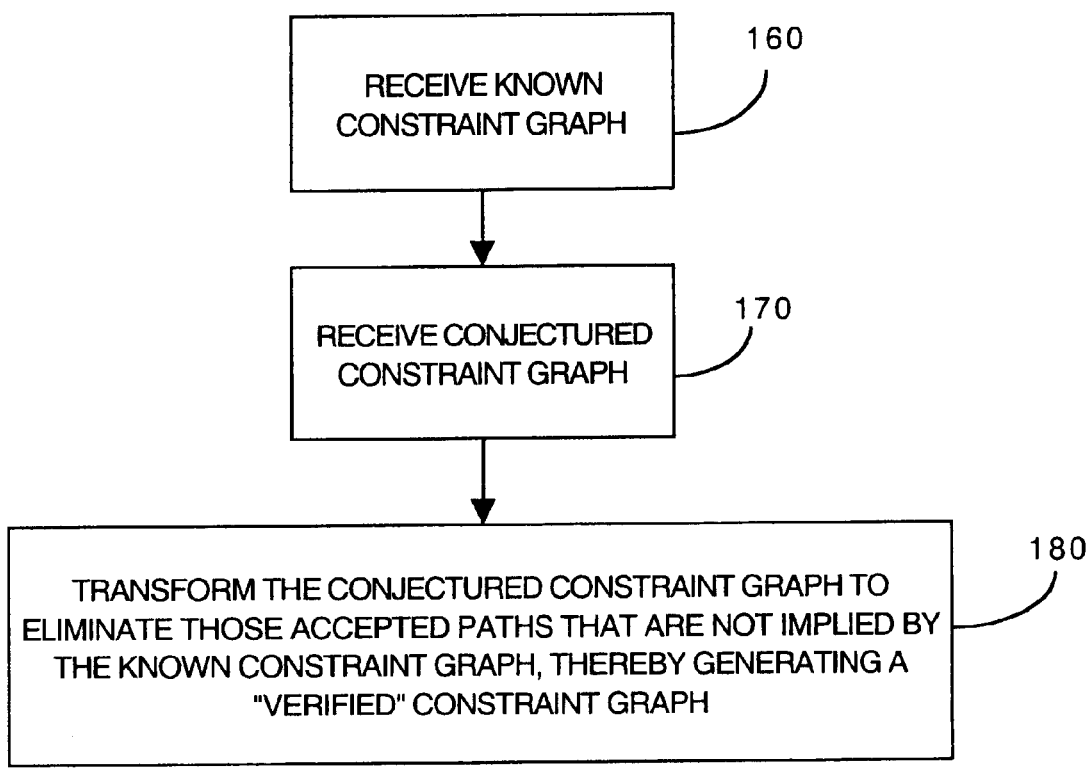
FIG. 6 is a flow chart showing generally acts associated with carrying out the verification algorithm (verifier) of the present invention.

Referring now to FIG. 6, the acts associated with carrying out the verification algorithm (verifier) of the present invention is generally shown.

Figure 1:
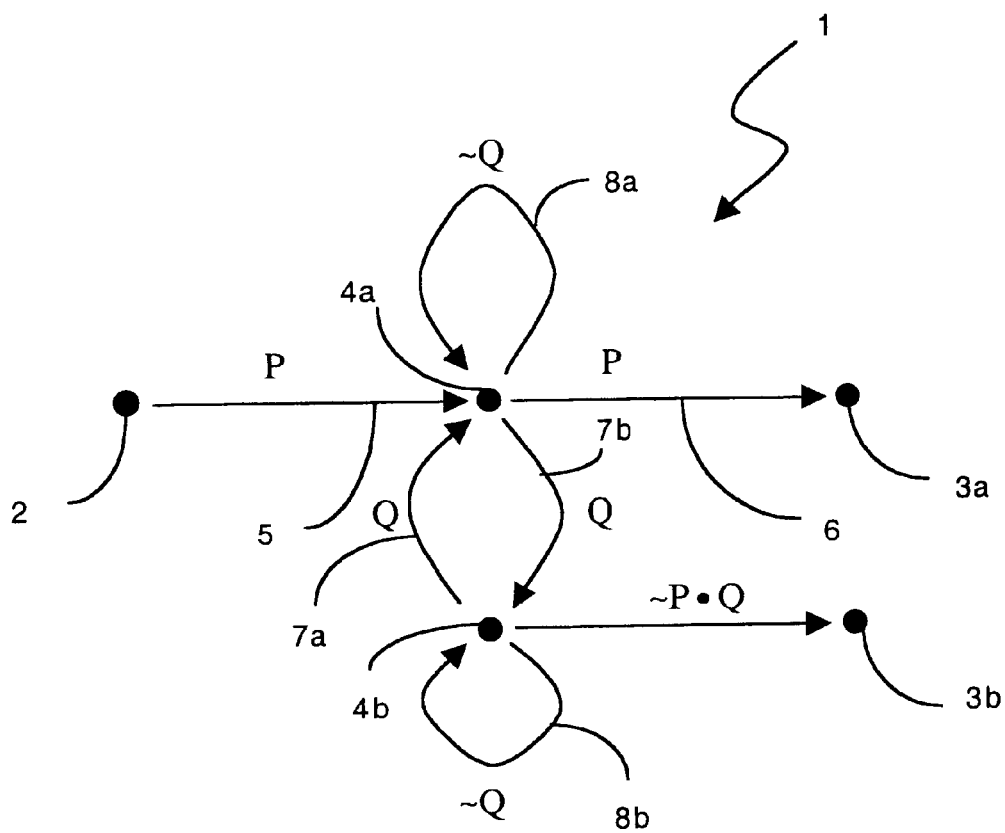
FIG. 1 depicts a constraint graph in accordance with the present invention.
Figure 7:
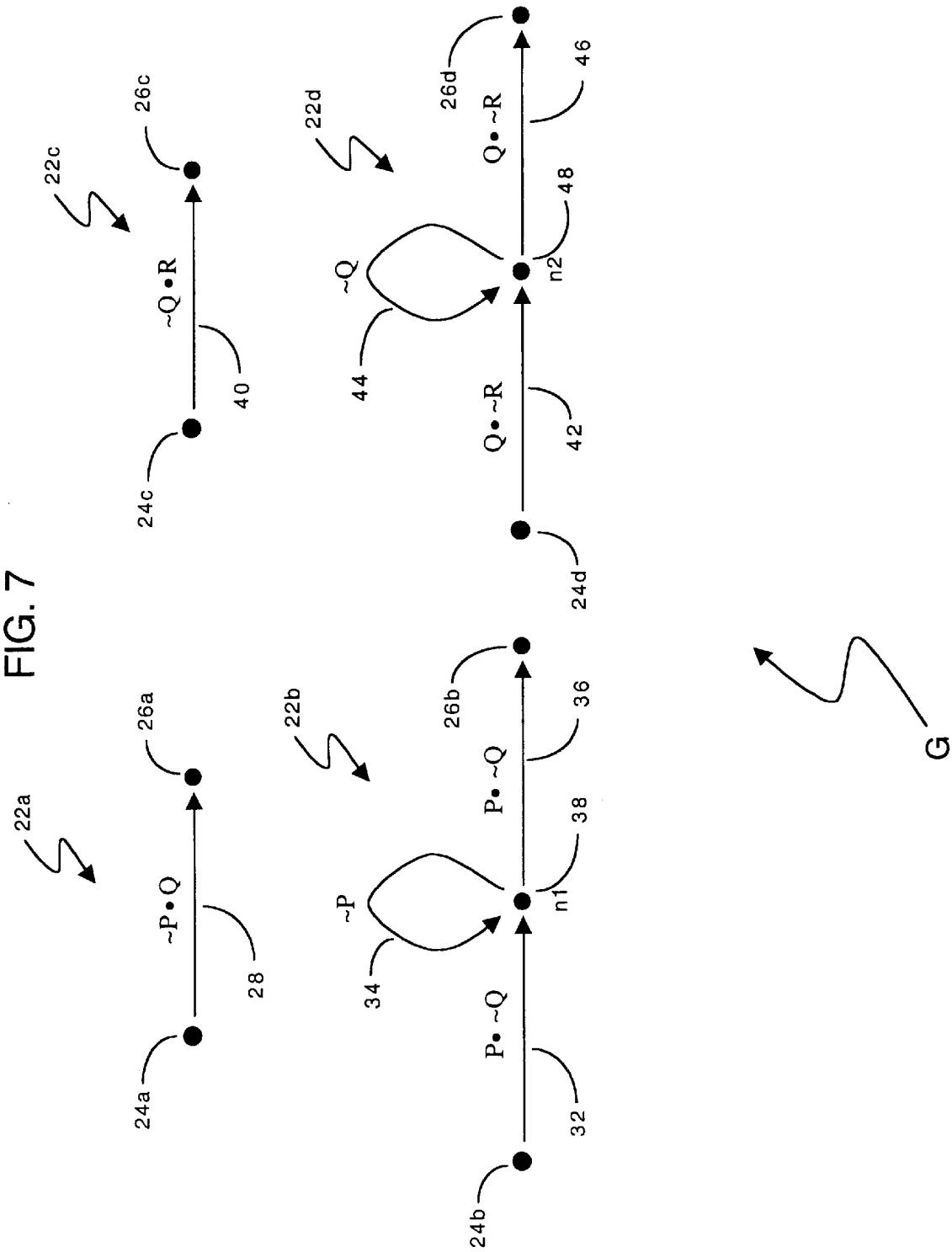
FIG. 7 depicts an illustrative constraint graph "G" which may be used as the first "known" constraint graph.

At box 160, a first "known" constraint graph is received by the verifier. The "known" constraint graph depicts constrained behaviors which are deemed true. The input may be received from a user via a user interface or may be received from another software application used in conjunction with the verifier. As noted above in conjunction with FIG. 1, constraint graphs will be represented using conventional finite-state acceptor graphs. The "known" constraint graph includes at least one path (representing a "constrained behavior") from an initial node to a terminal node, and may include zero or more internal nodes. More than one path (i.e., multiple constrained behaviors) may be provided during box 160. For example, FIG. 7 depicts an example of a constraint graph (G) describing multiple constrained behaviors, generally designated 22a, 22b, 22c, 22d.

Constraint behavior 22a includes an arc 28 having as its Boolean formula (~P·Q). Arc 28 begins at initial node 24a and ends at terminal node 26a.

Constraint behavior 22b includes arc 32 having as its Boolean formula (P·~Q). Arc 32 begins at initial node 24b and ends at internal node (n1) 38. Constraint 22b further includes arc 34 having as its Boolean formula (~P). Because arc 34 is a loop, arc 34 begins and ends at the same node (n1) 38. Constraint 22b also includes arc 36 having as its Boolean formula (P·~Q). Arc 36 begins at internal node (n1) 38 and ends at terminal node 26b.

Constraint behavior 22c includes an arc 40 having as its Boolean formula (~Q·R). Arc 40 begins at initial node 24c and ends at terminal node 26c.

Constraint behavior 22d includes arc 42 having as its Boolean formula (Q·~R). Arc 42 begins at initial node 24d and ends at internal node (n2) 48. Constraint 22d further includes arc 44 having as its Boolean formula (~Q). Because arc 44 is a loop, arc 44 begins and ends at the same node (n2) 48. Constraint 22d also includes arc 46 having as its Boolean formula (Q·~R). Arc 46 begins at internal node (n2) 48 and ends at terminal node 26d.

It is noted that constraint graph G depicted in FIG. 7 is only illustrative, and not in any way limiting.

After the verifier receives the "known" constraint graph during box 160 (FIG. 6), box 170 is then carried out.

At box 170, a second "conjectured" constraint graph is received by the verifier. The "conjectured" constraint graph depicts the constrained behavior that is to be verified by the verifier. The input of the "conjectured" constraint graph may be received from a user via a user interface or may be received from another software application used in conjunction with the verifier. As noted above in conjunction with FIG. 1 and FIG. 7, constraint graphs will be represented using conventional finite-state acceptor graphs.

Figure 8:
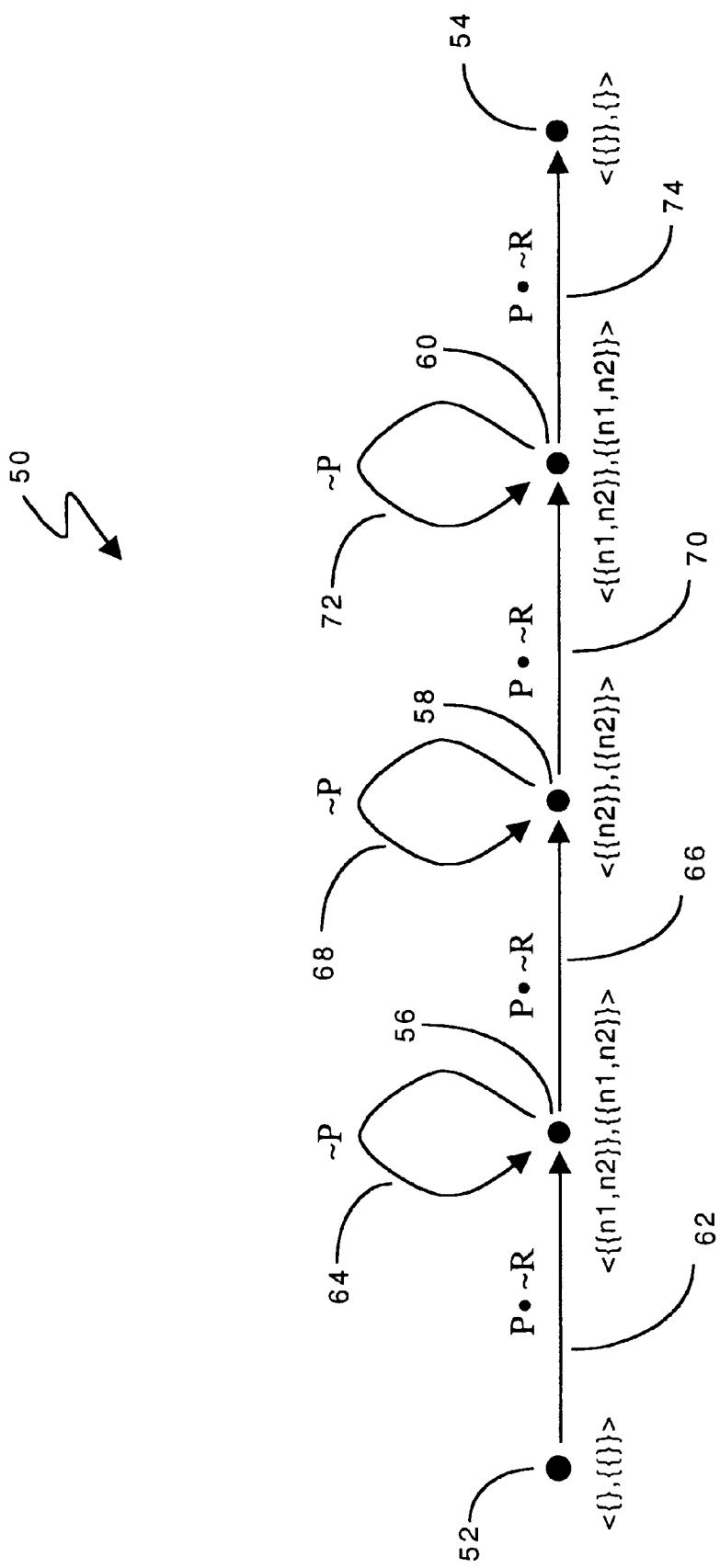
FIG. 8 depicts an illustrative conjectured constraint graph.

FIG. 8 depicts an illustrative conjectured constraint graph 50. Constraint graph 50 includes an initial node 52 and a terminal node 54. Constraint graph 50 further includes three internal nodes 56, 58, 60 and arcs 62, 66, 70 and 74. Arc 62 begins at initial node 52 and ends at internal node 56 and has as its Boolean formula (P·~R). Arc 64 is a loop which begins and ends at internal node 56 and has as its Boolean formula (~P). Arc 66 begins at internal node 56 and ends at internal node 58 and has as its Boolean formula (P·~R). Arc 68 is a loop which begins and ends at internal node 58 and has as its Boolean formula (~P). Arc 70 begins at internal node 58 and ends at internal node 60 and has as its Boolean formula (P·~R). Arc 72 is a loop which begins and ends at internal node 60 and has as its Boolean formula (~P). Arc 74 begins at internal node 60 and ends at terminal node 54 and has as its Boolean formula (P·~R).

After the verifier receives the "conjectured" constraint graph during box 170 (FIG. 6), box 180 is then carried out.

At box 180, the verifier transforms paths in the conjectured constraint graph (from box 170) such that the represented constraints follow from (i.e, are implied by) the known constraint graph (from box 160). The details of the transforming algorithm are described in greater detail in conjunction with FIG. 9 through FIG. 19 below. In general, the second graph is transformed into a resultant "verified" graph by "accepting" only those paths that are implied by the first graph and which appear in the second graph. The resulting constraints represented in this "verified" constraint graph are implied by the constraints defined in the "known" constraint graph. From the verified constraint graph, the user (or other software application) is able to determine whether the conjectured constraint graph (from box 170) was properly verified.

Figure 9:
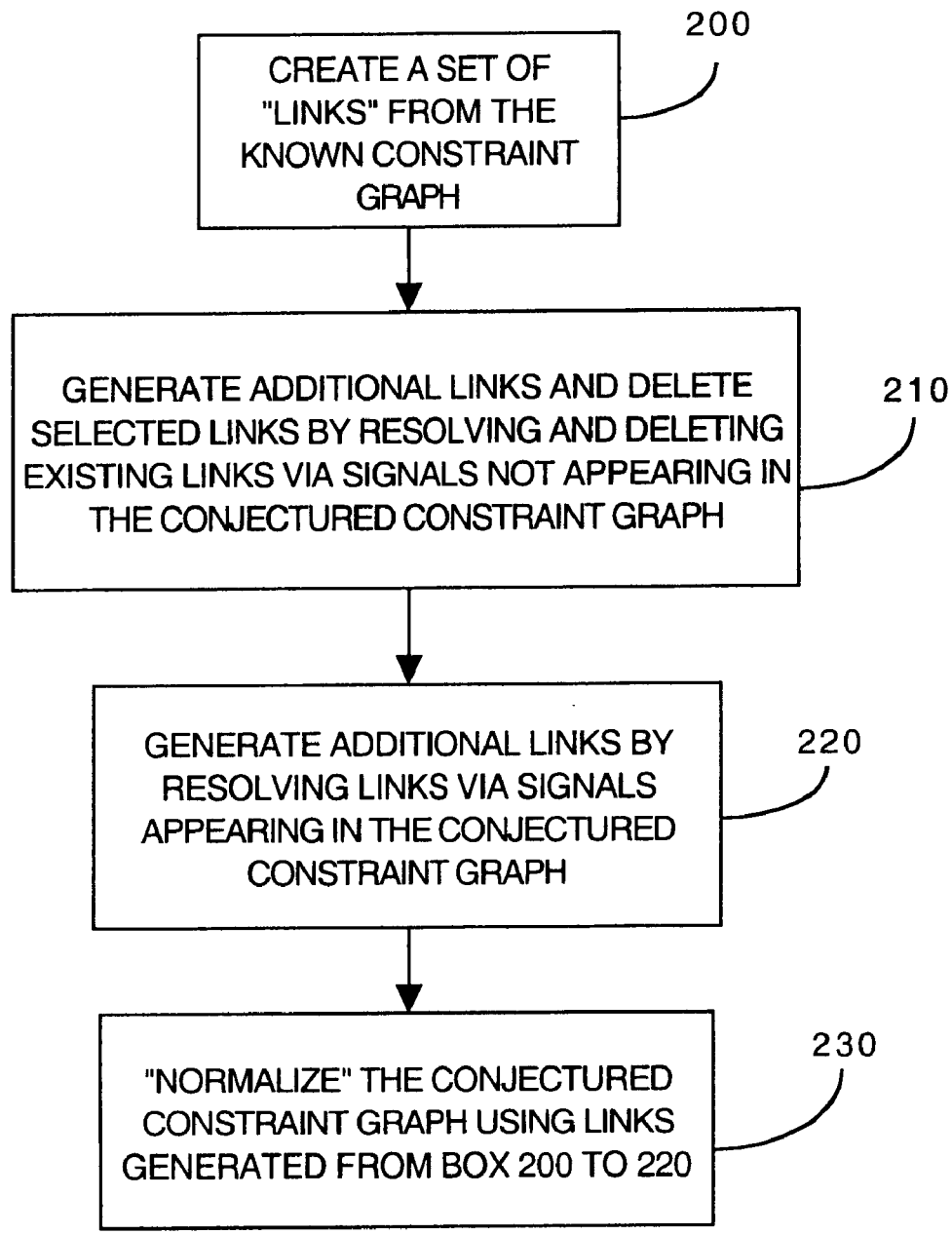
FIG. 9 is a flow chart generally showing the acts associating with the transforming algorithm of the present invention.

Referring now to FIG. 9, the details of the transforming algorithm are generally shown. The transforming algorithm (FIG. 9) makes use of several data structures during the transforming sequence (box 200 through 230 of FIG. 9, as well as FIG. 10 through FIG. 19). It will be apparent to those skilled in the art, that the data structures described herein (Table 1 through Table 6 below) are for illustrative purposes, and that other data structures may be used in conjunction with the present invention without departing from the scope of the invention.

The invention utilizes a plurality of data structures to represent both "known" constraint graph and "conjectured" constraint graph as well as "Links". As described above (FIG. 1 and FIG. 7), constraint graphs include nodes (initial nodes, terminal nodes, and internal nodes) as well as arcs directed from one node to another, each arc labeled with a Boolean formula.

A "Link" data structure is used during the transforming sequence and may be represented by the following structure:

TABLE 1

```
struct Link
{
    SetOfSetsOfNodes        Aft;
    BooleanFormula          BooleanFormula;
    SetOfSetsNodes          Fore;
}
```

In Table 1, the "Aft" data member of "SetOfSetsOfNodes" type is associated with the backward direction of a link, while the "Fore" data member of "SetOfSetsOfNodes" type is associated with the forward direction of the link. The "BooleanFormula" data member contains the Boolean formula for the link. Links are described in further detail below in conjunction with FIG. 9 through FIG. 12.

The known constraint graph uses two data structures, representing "Nodes" and "Arcs". The "Node" data structure for the "known" constraint graph may be represented by the following structure:

TABLE 2

```
struct Node
{
    List<Arc>       In;
    List<Arc>       Out;
}
```

In Table 2, the "In" data member of "List" type includes the list of Arcs entering a node, while the "Out" data member includes the list of Arcs exiting the node. By way of example, node (n1) 38 of FIG. 7 includes two entering (incoming) arcs (ARC 32 and ARC34) and two exiting arcs (ARC 34 and ARC 36).

The "Arc" data structure for the "known" constraint graph may be represented by the following structure:

TABLE 3

```
struct Arc
{
    Node*               Tail;
    Boolean Formula     Boolean Formula;
    Node*               Head
}
```

In Table 3, the data members of a "known" constraint graph "arc" are defined. It is noted that arcs have "direction" as depicted by the arrow representing an arc, where the arrowhead end of an defines the "head" and the other end represents the "tail". The "Tail" data member of "Node*" type defines a pointer to a node defining the tail of the arc. The "Head" data member defines a pointer to another node which defines the head of the arc. The "BooleanFormula" data member contains the Boolean formula for the arc. For example, in FIG. 7a, the "tail" of ARC 28 is node 24a while the "head" of ARC 28 is node 26a as defined by the direction of the arc. ARC 28 also defines its Boolean formula to be (~P·Q) which would b e defined in data member "BooleanFormula".

The "conjectured" constraint graph also uses two data structures represented as "Node" and "Arc" as described herein. The "Node" data structure for the "conjectured" constraint graph may be represented by the following structure:

TABLE 4

```
struct Node
{
    SetOfSetsOfNodes        Aft;
    SetOfSetsOfNodes        Fore;
    List<Arc>               In;
    List<Arc>               Out;
    Bool Maximized
}
```

In Table 4, the "Aft" data member of "SetOfSetsOfNodes" type is associated with the backward direction of a node, while the "Fore" data member of "SetOfSetsOfNodes" type is associated with the forward direction of the node. The "In" data member of "List" type includes the list of Arcs entering the node, and the "Out" data member includes the list of Arcs exiting the node. The "Maximized" data member of "Bool" (Boolean) type indicates whether the node has been "maximized". Maximized nodes are described further below in conjunction with FIG. 13 and FIG. 14.

The "Arc" data structure for the "conjectured" constraint graph may be represented by the following structure:

TABLE 5

```
struct Arc
{
    Node*                   Tail;
    BooleanFormula          BooleanFormula;
    Node*                   Head;
    Bool Maximized;
    SetOfSetsOfNodes        Fore
}
```

In Table 5, the data members of a "conjectured" constraint graph "arc" are defined. The "Tail" data member of "Node*" type defines a pointer to a node defining the tail of the arc, and the "Head" data member defines a pointer to a node defining the head of the arc. The "BooleanFormula" data member contains the Boolean formula for the arc. The "Maximized" data member of "Bool" (Boolean) type indicates whether the arc has been "maximized". Maximized arcs are described further below in conjunction with FIG. 13 and FIG. 14. The "Fore" data member of "SetOfSetsOfNodes" type is associated with the forward direction of the node.

Referring again to FIG. 9, at box 200, a set of "Links" L are created from the "known" constraint graph (from box 160). Link creation is described in more detail below in conjunction with FIG. 10 and FIG. 11. In general, links are derived from arcs in the "known" constraint graph (i.e., for each arc in the "known" constraint graph, a link is created). Box 210 is then carried out.

At box 210, links (created from box 200) are "resolved" and "deleted" via signals that are not mentioned in the "conjectured" constraint graph (from box 170). Link resolving is described in further detail below in conjunction with FIG. 12. If a link's "BooleanFormula" mentions signal S (where S is a signal that is not in the "conjectured" constraint graph), the link is deleted or otherwise discarded. Box 220 is then carried out.

Figure 12:
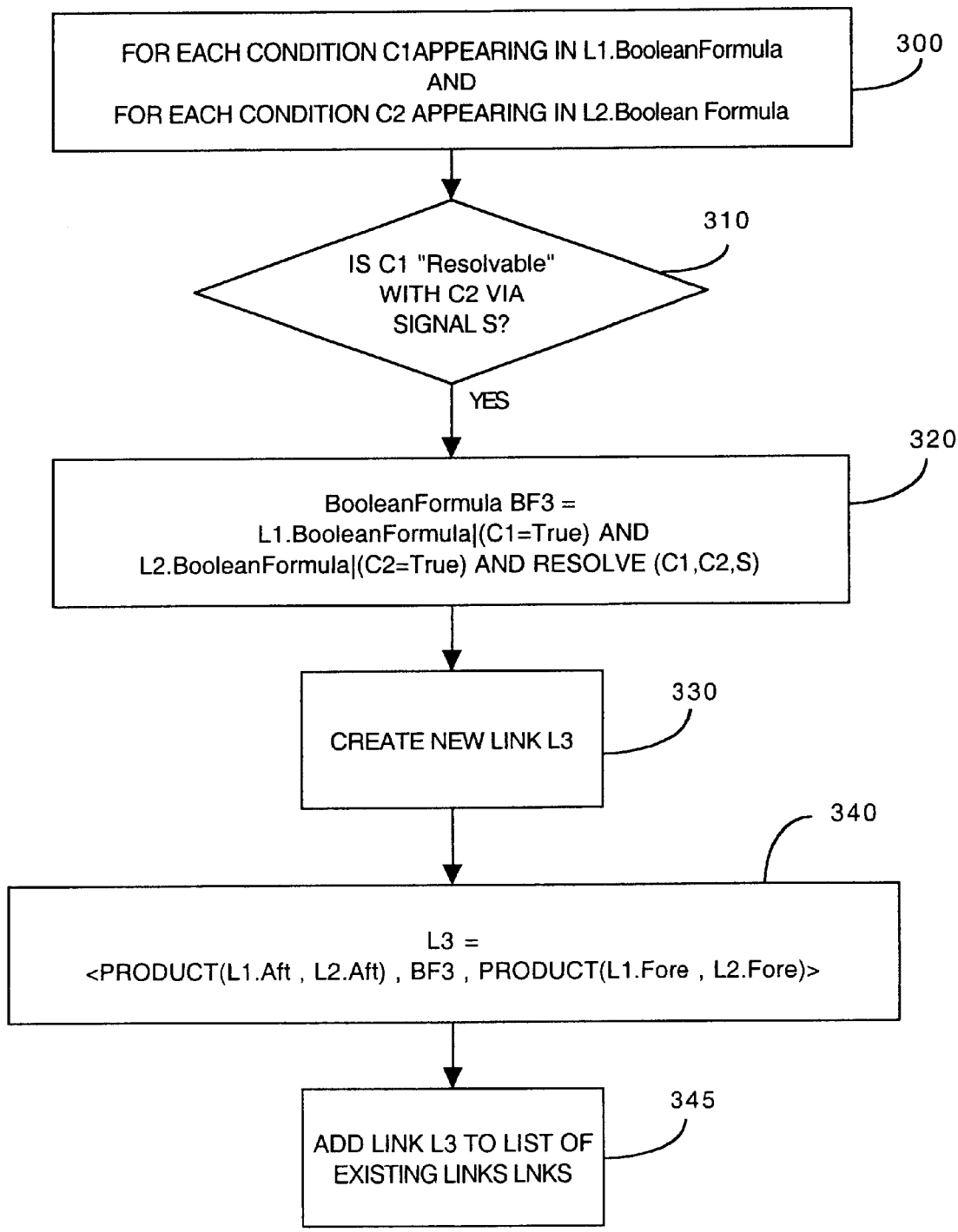
FIG. 12 is a flow chart generally showing the acts associated with creating a new link by resolving Link L1 with Link L2 via Signal S.

At box 220, links (from box 200 and box 210) are "resolved" via signals that are mentioned in the "conjectured" constraint graph. It is noted that these links are not deleted as carried out in box 210. FIG. 12 below describes further the link resolving sequence. Box 230 is then carried out.

At box 230, the "conjectured" constraint graph is "normalized" using the links generated from box 200 through box 220. Graph normalization is described in further detail below in conjunction with FIG. 13 through FIG. 15. The resultant graph after normalization is "verified" (implied from the "known" constraint graph) and is the graph generated in box 180 of FIG. 6.

Figure 10:
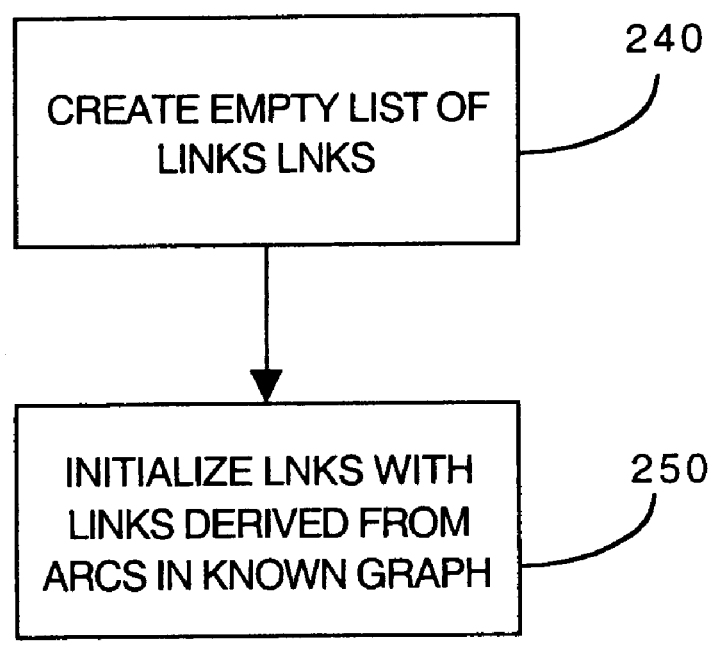
FIG. 10 is a flow chart generally showing the acts associated with creating links from the "known" constraint graph.

Referring now to FIG. 10, there is shown generally the acts associated with creating links from the "known" constraint graph, referenced above in box 200 of FIG. 9. In general, for each arc A in the "known" constraint graph, a new link L(i) is created. The data structures for arcs in the "known" constraint graph are described above in conjunction with Table 3. The data structures for links are also described above in conjunction with Table 1.

At box 240, an empty list of Links L is created. As noted above, a new Link L(i) will be created for each arc in the "known" constraint graph. In the example "known" constraint graph depicted in FIG. 7, the list of Links L will have eight items (L(1) through L(8)), corresponding to the eight arcs 28, 32, 34, 36, 40, 42, 44, 46, respectively. Box 250 is then carried out.

At box 250, Links L are initialized with links derived from the arcs in the "known" constraint graph. Here, the data members Aft, BooleanFormula, and Fore for each Link L(i) are initialized according to the algorithm described in FIG. 11.

Figure 11:
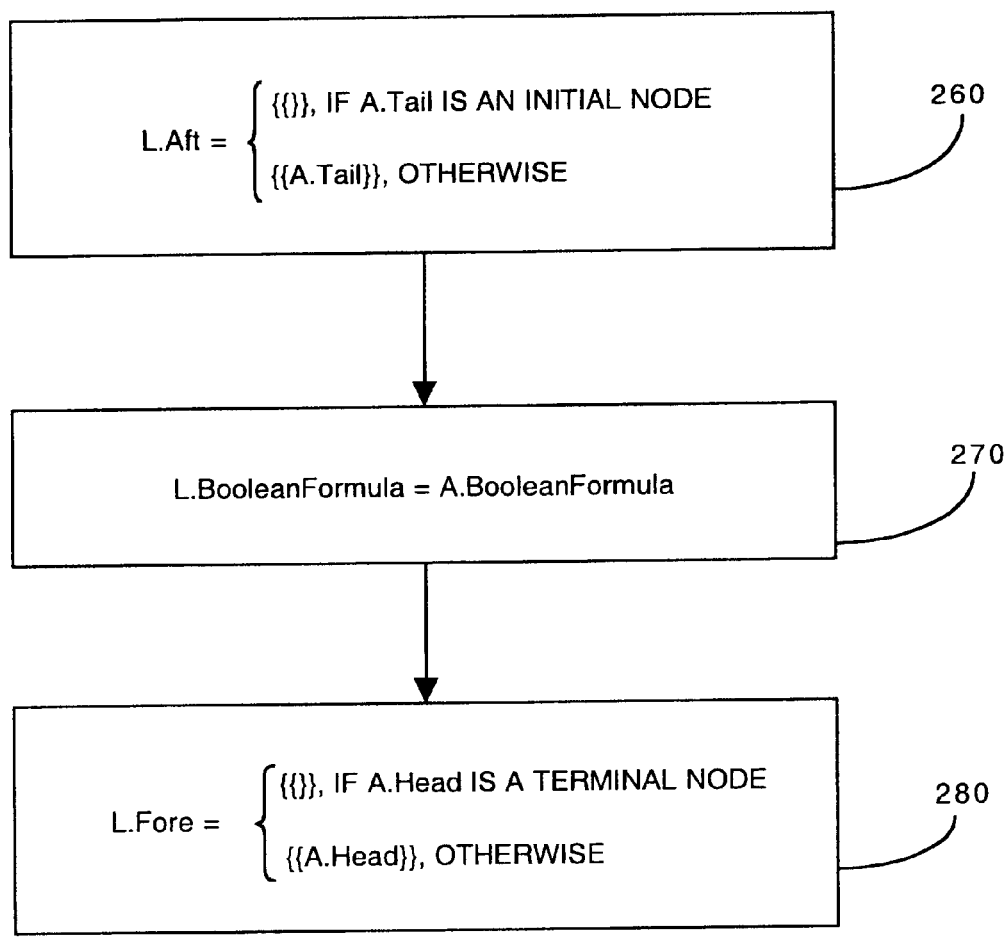
FIG. 11 is a flow chart generally showing the acts associated with deriving a Link L(i) from an arc A.

Referring next to FIG. 11, there is generally shown the acts associated with deriving a Link L(i) from an arc A. As noted above, Arcs for "known" constraint graphs include Tail, BooleanFormula, and Head data members. The following description will be more fully understood in light of the illustrative "known" constraint graph depicted in FIG. 7 described above. In FIG. 7, ARC 28 has initial node 24a as its "Tail", (~P·Q) as its BooleanFormula, and terminal node 26a as its "Head". Also in FIG. 7, ARC 32 has initial node 24b as its "Tail", (P·~Q) as its BooleanFormula, and internal node (n1) 38 as its "Head". Again in FIG. 7, ARC 34 has internal node (n1) 38 as its "Tail", (~P) as its BooleanFormula, and internal node (n1) 38 as its "Head". ARC 36 (also from FIG. 7) has internal node (n1) 38 as its "Tail", (P·~Q) as its BooleanFormula, and terminal node (n1) 26b as its "Head".

At box 260, the "Aft" data member for Link L(i) is generated according to the following rule:

$$L(i).Aft = \begin{cases} \{\{\}\} & \text{if } A.Tail \text{ is an initial node} \\ \{\{A.Tail\}\} & \text{otherwise} \end{cases}$$

For example, for L(1) derived from ARC 28, L(1).Aft would be initialized to the set containing the empty set {{ }} since the tail of ARC 28 points to initial node 24a. Similarly, for L(2) derived from ARC 32, L(2).Aft would be initialized to the set containing the empty set {{ }} since the tail of ARC 32 points to initial node 24b. However, for L(3) derived from ARC 34, L(3).Aft would be initialized to {{A.Tail}} since the tail of ARC 34 is not an initial node but rather the internal node (n1) 38. Thus, L(3).Aft would be initialized to {{In}}. For L(4) derived from ARC 36, L(4).Aft would be initialized to {{A.Tail}} since the tail of ARC 36 is not an initial node but rather internal node (n1) 38. In this way, L(4).Aft would be initialized to {{n1}}. Box 270 is then carried out.

At box 270, the "BooleanFormula" data member for Link L(i) is generated according to the following rule:

L(i).BooleanFormula=A.BooleanFormula.

Accordingly, the BooleanFormula for the Link L(i) is initialized to the BooleanFormula from the corresponding Arc. For example, for L(1) derived from ARC 28, L(1).BooleanFormula would be set to the BooleanFormula for ARC 28 which is (~P·Q). L(2), which is derived from ARC 32, would define L(2).BooleanFormula to be the Boolean-Formula for ARC 32 which is (P·~Q). L(3) which is derived from ARC 34 would set L(3).BooleanFormula to be the BooleanFormula for ARC 34 which is (~P). L(4) which is derived from ARC 36 would set L(4).BooleanFormula to be the BooleanFormula for ARC 36 which is (P·~Q). Box 280 is then carried out.

At box 280, the "Fore" data member for Link L(i) is generated according to the following rule:

$$L(i).Fore = \begin{cases} \{\{\}\} & \text{if } A.Head \text{ is an initial node} \\ \{\{A.Head\}\} & \text{otherwise} \end{cases}$$

For example, for L(1) derived from ARC 28, L(1).Fore would be initialized to the set containing the empty set {{ }} since the head of ARC 28 is terminal node 26a. However, for L(2) derived from ARC 32, L(2).Fore would be initialized to {{A.Head}} since the head of ARC 32 does not point to a terminal node but rather to internal node (n1) 38. Thus L2.Fore would be initialized to {{n1}}. Similarly, for L(3) derived from ARC 34, L(3).Fore would be initialized to {{A.Head}} since the head of ARC 34 does not point to a terminal node but rather to internal node (n1) 38. Thus L3.Fore would be initialized to {{n1}}. However, for L(4) derived from ARC 36, L(4).Fore would be initialized to the set containing the empty set {{ }} since the head of ARC 36 points to terminal node 26b.

Thus, links L(1) through L(4) would be set as follows (from the example data provided from FIG. 6a and FIG. 7b):

L(1)=<{{ }}, (~P·Q), {{ }}>

L(2)=<{{ }}, (P·~Q), {{n1}}>

L(3)=<{{n1}}, (~P), {{n1}}>

L(4)=<{{n1}}, (P·~Q), {{ }}>.

Referring next to FIG. 12, there is generally shown the acts associated with creating a new link by resolving Link L1 with Link L2 via Signal S, also referenced above in boxes 210 and 220 of FIG. 9. It is noted that the following sequence is carried out for each pair of links L1 and L2 in the set LNKS, which is initialized as described in FIG. 10.). As described in the process below, a pair of links will yield a new link only if those two links are "resolvable".

At box 300, a condition C1 appearing in L1.BooleanFormula is selected and a condition C2 appearing in L2.BooleanFormula is selected. The following sequence (diamond 310 through box 345) is then carried out for each such pair of conditions.

Figure 16:
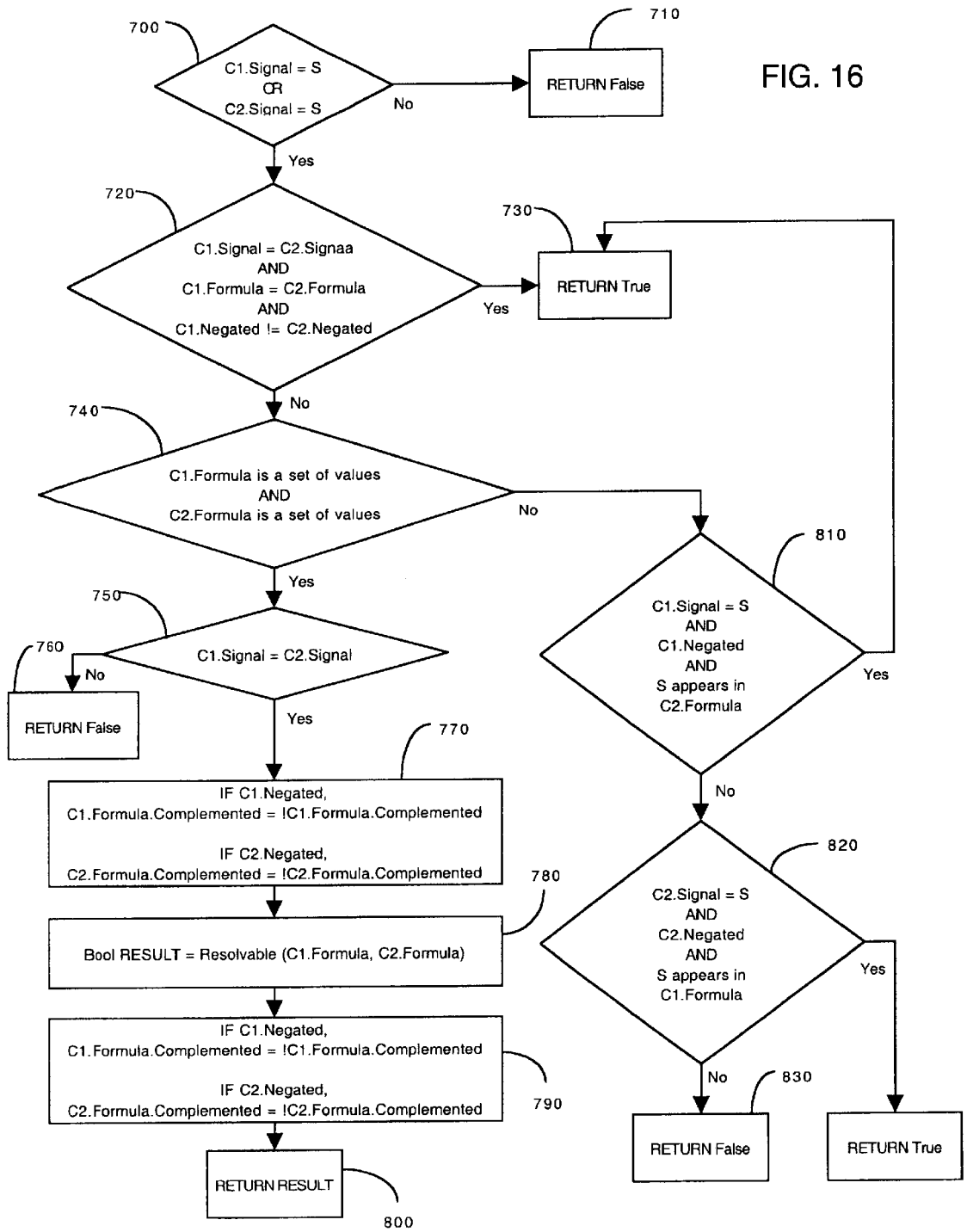
FIG. 16 is a flow chart generally showing the acts associated with determining whether a first condition C1 is resolvable with a second condition C2 via a signal S.

At diamond 310, C1 and C2 are tested to see if they are "Resolvable" via Signal S, as described in FIG. 16. If that is the case, then the remaining acts (box 320 through box 345) are performed. Otherwise, the operation is aborted without the creation of a new link.

At box 320, the "BooleanFormula" data member "BF3" for the new link "L3" is set to the conjunction, "AND", of the three Boolean Formulas: L1.BooleanFormula(C1=True), L2.BooleanFormula(C2=True) and RESOLVE(C1,C2,S). L1.BooleanFormula(C1=True) is the Boolean Formula obtained when C1 is set to True in L1.BooleanFormula. L2.BooleanFormula(C2=True) is the Boolean Formula obtained when C2 is set to True in L2.BooleanFormula. It is noted that the set of states in which Boolean-formula BF3 holds (is true) is a subset of the set of states in which either L1.BooleanFormula holds or L2.BooleanFormula holds.

RESOLVE(C1,C2,S) is best illustrated by example.

Resolve Example 1: If S is a Boolean Signal, then the condition "S=True" can be resolved with the condition "S=False" via Signal S to produce the condition "True".

Resolve Example 2: If S is any Signal, then the condition "S=formula" can be resolved with the condition "S!=formula" via Signal S to produce the condition "True".

Resolve Example 3: If S is a Signal of an enumeration type with enumerators {Red, Green, Yellow, Purple}, then the condition "S=(Red or Green)" can be resolved with the condition "S=(Green or Yellow)" via Signal S to produce the condition "S=(Red or Green or Yellow)".

Resolve Example 4: If S is a signal of an enumeration type with enumerators {Red, Green, Yellow, Purple}, then the condition "S=(Red or Green)" can be resolved with the condition "S=(Green or Yellow or Purple)" via Signal S to produce the condition "S=(Red or Green or Yellow or Purple)" which is equivalent to the condition "True".

Resolve Example 5: If S and T are signals, such that S appears in formula 1, then the condition "T=formula1" can be resolved with the condition "S!=formula2" via Signal S to produce the condition "T=formula3" where formula3 is obtained from formula1 by substituting formula2 for each instance of S in formula1.

At box 330, a new link L3 is created. Box 340 is then carried out.

At box 340, L3 is set equal to:

<Product(L1.Aft, L2.Aft), BF3, Product(L1.Fore, L2.Fore)> where the "Product" calculation is carried out using the calculation described above in conjunction with FIG. 3. Box 345 is then carried out.

At box 345, L3 is added to the list of existing links LNKS.

Figure 13:
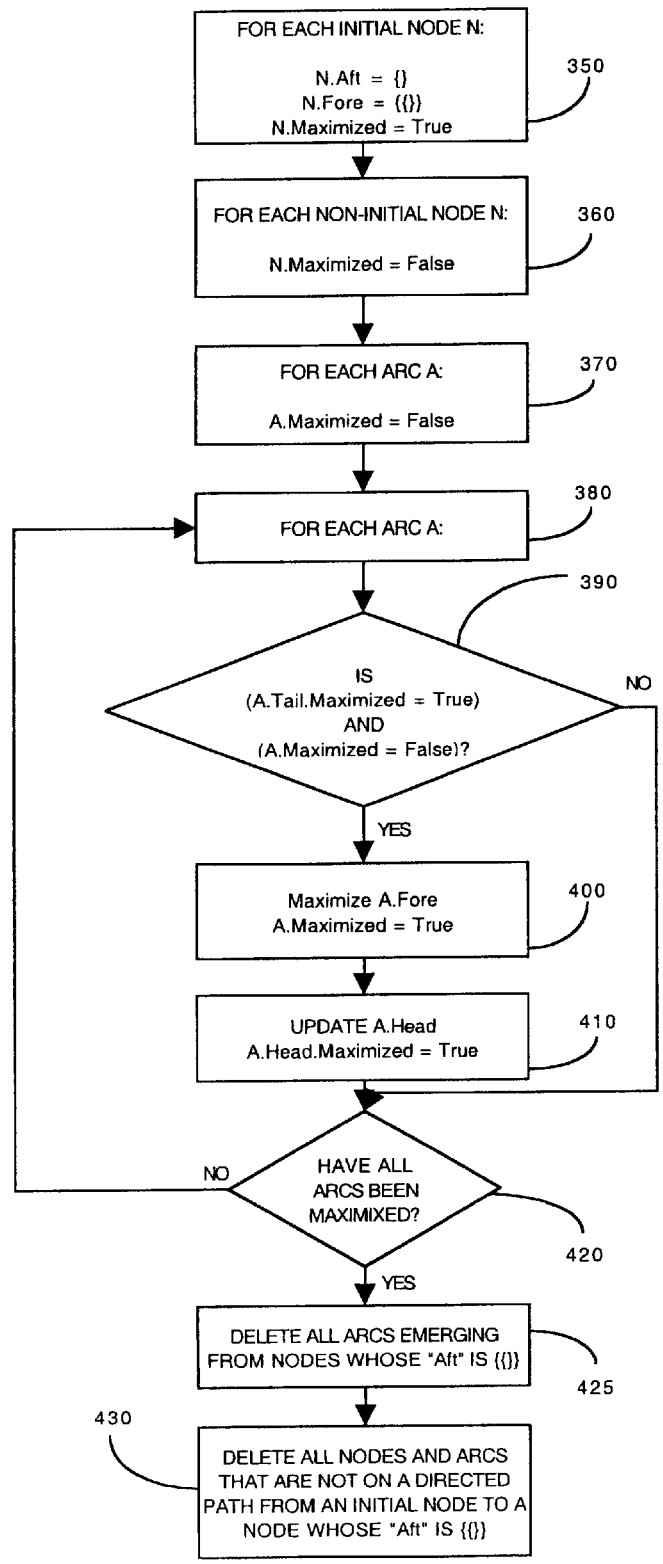
FIG. 13 is a flow chart generally showing the acts associated with normalizing the "conjectured" constraint graph using links.

Referring now to FIG. 13, there is generally shown the acts associated with normalizing the "conjectured" constraint graph using the links generated from box 200 through box 220 of FIG. 9. This sequence is also referred to in box 230 of FIG. 9.

At box 350, for each initial node N in the "conjectured" constraint graph, the data members N.Aft, N.Fore and N.Maximized are initialized as follows:

N.Aft={ }

N.Fore={{ }}

N.Maximized=True

Example "conjectured" constraint graph depicted in FIG. 8 includes one initial node 52, and thus node 52 would have its data members set according to the above definition. Box 360 is then carried out.

At box 360, for each non-initial node N in the "conjectured" constraint graph, the "Maximized" data member is set to "False". Example "conjectured" constraint graph depicted in FIG. 8 includes four non-initial nodes 56, 58, 60, 54. Accordingly, each non-initial node 56, 58, 60, 54 would have its "Maximized" data member set to "False". Box 370 is then carried out.

At box 370, for each arc A in the "conjectured" constraint graph, the "Maximized" data member is set to "False". Thus, ARCs 62, 64, 66, 68, 70, 72 and 74 in example "conjectured" constraint graph depicted in FIG. 8 would have its respective "Maximized" data member set to False. Box 380 is then carried out.

At box 380, a loop structure—incorporating boxes 380 through 420—is provided in which each arc A in the "conjectured" constraint graph is "maximized". Following box 380, diamond 390 is then carried out.

At diamond 390, the invention determines whether the tail of the arc A presently under consideration has already been "Maximized" and whether arc A has not yet "Maximized". If both conditions are satisfied, then box 400 is carried out. Otherwise, looping structure 420 is carried out. Initially, all arcs have their "Maximized" data member set to False (box 370). Thus each arc A will be processed via box 400 and 410 as described below at least once. It is also noted that arc A's "Tail" data member is a pointer to a "node" data type structure (see Table 4). As such, the "Tail" data member of arc A has a "Maximized" data member of "bool" type (see Table 4). In this way, the invention is able to ascertain the "Maximized" value of A.Tail by inspecting the value of the "Maximized" data member of the node pointed to by A.Tail.

At box 400, the "Fore" data member of arc A is maximized. Also at box 400, the "Maximized" data member for arc A is set to "True". The details of maximizing the "Fore" of arc A are described in further detail in conjunction with FIG. 14 below. Box 410 is then carried out.

At box 410, the "Head" data member of arc A is updated. Also at box 410, the "Maximized" data member for the "head" of arc A is set to True. The details of updating the head of an arc A are described in further detail in conjunction with FIG. 15 below. Looping structure 420 is then carried out.

At looping structure 420, acts 380 through 410 are repeated for the next arc A in the "conjectured" constraint graph. After all the arcs in the "conjectured" constraint graph have been processed so that no arc satisfies the condition in box 390, box 425 is then carried out.

At box 425, all arcs emerging from those nodes N such that N.Aft={{ }} are deleted. These deleted arcs are superfluous as they merely extend paths that already define constraints. Box 430 is then carried out.

At box 430, all nodes and arcs that are not on a directed path starting at an initial node and ending at a node whose "Aft" data member is the set containing the empty set, {{ }}, are deleted. The resultant (verified) graph now accepts only those paths that follow logically from the first (known) graph and appear in the second (conjectured) graph.

Figure 14:
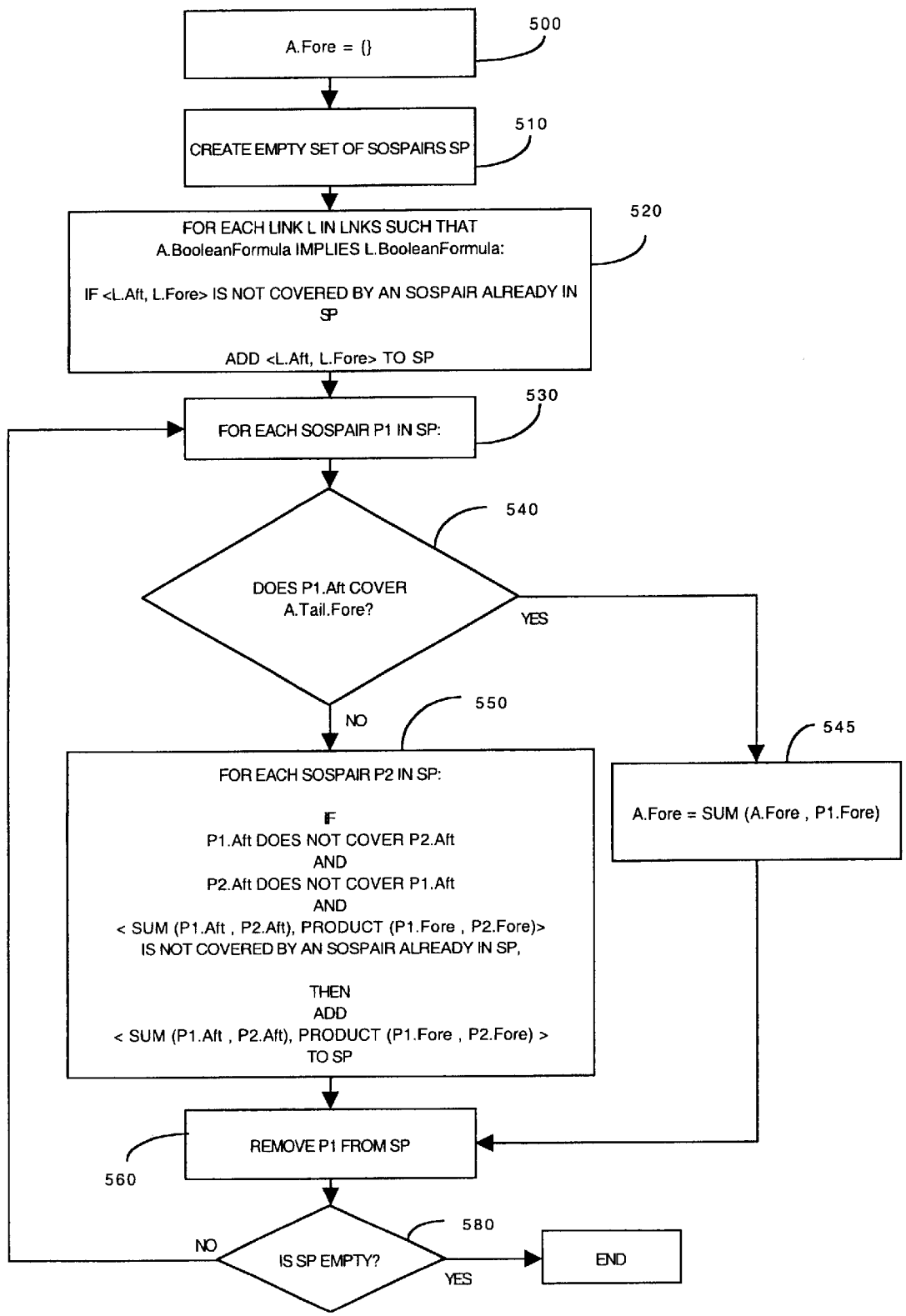
FIG. 14 is a flow chart generally showing the acts associated with maximizing the "Fore" of an arc A using links.

Referring now to FIG. 14, there is generally shown the acts associated with maximizing the "Fore" of an arc A using the links generated from box 200 through box 220 (FIG. 9). This sequence is carried out as part of box 400 of FIG. 13 described above. Maximizing the "Fore" of an arc A is the process of 1) calculating the maximal set of sets of nodes SOS—with respect to the partial order—such that <A.Tail.Fore, A.BooleanFormula, SOS> is a link of the known constraint graph, and (2) setting A.Fore equal to SOS. Maximizing the "Fore" of an arc A is also described in the following publications by the applicant which are incorporated herein by reference: THE THEORY OF CONSTRAINTS by Frederick C. Furtek in The Charles Stark Draper Laboratory, Report CSDL-P-1564, published May 4, 1982 and A NECESSARY AND SUFFICIENT CONDITION FOR A PRODUCT RELATION TO BE TOTAL by Frederick C. Furtek in Journal of Combinatorial Theory, Series A, Vol. 37, No. 3, published November 1984, pp 320–326.

At box 500, the "Fore" data member of Arc A is initialized to the empty set, { }. Box 510 is then carried out.

At box 510, an empty set SP of SOSPAIRS is created, where each SOSPAIR is an ordered pair of the form <SetOfSetsOfNodes, SetOfSetsOfNodes>. Box 520 is then carried out.

At box 520, SOSPAIRS derived from the links in LNKS—created in boxes 200 through box 220 (FIG. 9)—are added to SP. For each link L in LNKS such that A.BooleanFormula implies L.BooleanFormula and <L.Aft, L.Fore> is not "Covered" by an SOSPAIR already in SP, <L.Aft,L.Fore> is added to SP. It is noted that a Boolean formula P "implies" a Boolean formula Q if and only if Q holds (is True) in every state in which P holds (is True). The details of determining if one SOSPAIR "Covers" another SOSPAIR are described in conjunction with FIG. 19 below. Looping structure 530 is carried out next.

At box 530, a loop structure—incorporating boxes 530 through box 580—is provided whereby A.Fore is calculated using each SOSPAIR P1 in SP. Following box 530, diamond 540 is carried out.

At diamond 540, the invention determines whether P1.Aft "Covers" A.Tail.Fore, where P1 is the SOSPAIR presently under consideration. The details of determining whether one SetOfSetsOfNodes "Covers" another SetOfSetsOfNodes are described in conjunction with FIG. 18 below. If the condition is met, then box 545 is carried out. Otherwise, box 550 is carried out.

At box 545, A.Fore is updated. The new value of A.Fore is the Sum of the old value of A.Fore and P1.Fore. Following box 545, box 560 is carried out.

At box 550, an attempt is made to create a new SOSPAIR for each SOSPAIR P2 in SP. If (1) P1.Aft does not Cover P2.Aft and (2) P2.Aft does not Cover P1.Aft and (3) the SOSPAIR <Sum(P1.Aft,P2.Aft),Product(P1.Fore,P2.Fore)> is not covered by an SOSPAIR already in SP, then the SOSPAIR <Sum(P1.Aft,P2.Aft),Product(P1.Fore,P2.Fore)> is added to SP. As above, the details of determining whether one SetOfSetsOfNodes "Covers" another SetOfSetsOfNodes are described in conjunction with FIG. 18 below, and the details of determining if one SOSPAIR "Covers" another SOSPAIR are described in conjunction with FIG. 19 below. Following box 550, box 560 is carried out.

At box 560, the SOSPAIR P1 is removed from SP. Diamond 580 is then carried out.

At Diamond 580, the invention determines whether the set SP is empty. If that is the case, then the process of maximizing the Fore of an arc terminates. Otherwise, another iteration of the loop beginning at box 530 is performed with a new value for P1.

Figure 15:
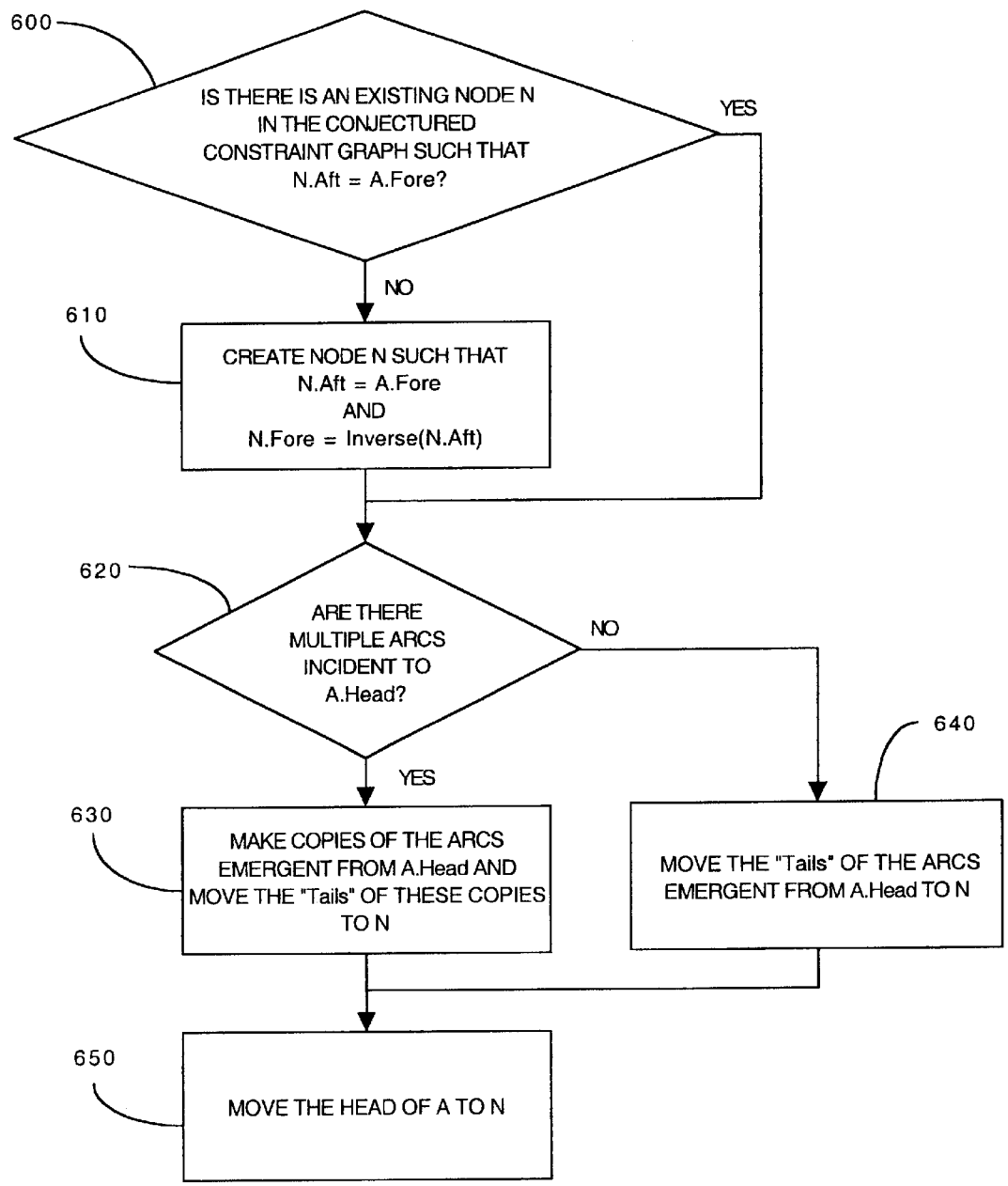
FIG. 15 is a flow chart generally showing the acts associated with updating the head of arc A.

Referring now to FIG. 15, there is generally shown the acts associated with updating the head of arc A. This sequence is carried out as part of box 410 in FIG. 13. Updating the head of arc involves moving the head of arc A to a node N such that N.Aft=A.Fore. A new node N is created if such a node does not already exist in the conjectured constraint graph.

At diamond 600, the invention determines whether there is an existing node N in the conjectured constraint graph such that the "Aft" data member of node N is equal to the "Fore" data member of arc A. If so, diamond 620 is carried out. Otherwise, box 610 is carried out.

At box 610, a new node N is created in the conjectured constraint graph such that the "Aft" data member of node N equals the "Fore" member of arc A (i.e., N.Aft=A.Fore) and such that the "Fore" data member for node N equals the Inverse of "N.Aft" (i.e., N.Fore=Inverse(N.Aft)). The inverse calculation is carried as described above in conjunction with FIG. 4. Diamond 620 is then carried out.

At diamond 620, the invention determines whether there are multiple arcs incident to A.Head. If so, box 630 is carried out. Otherwise, box 640 is carried out.

At box 630, copies of arcs emergent from A.Head are made and the "Tail" data members of these copied arcs are updated to point to node N. Box 650 is then carried out.

At box 640, the "Tail" data member of the arcs emergent from A.Head are updated to point to node N. Box 650 is then carried out.

At box 650, the "head" data member of Arc A is updated to point to node N. After box 650, the head of arc A has been "updated" according to the present invention.

Referring now to FIG. 16, there is generally shown the acts associated with determining whether Conditions C1 and C2 are resolvable via signal S. This sequence is carried out as part of box 310 of FIG. 12 described above. For purposes of this discussion, we assume each Condition is represented by the following structure:

TABLE 6

| struct Condition { | |
|---|---|
| Signal* | Signal; |
| Formula | Formula; |
| Bool | Negated; |
| } | |

To illustrate how the structure of Table 6 is interpreted, assume that C is a condition, that C.Signal=S and that C.Formula=F. There are two cases to consider: (1) C.Negated=False and (2) C.Negated=True. For the case C.Negated=False, C can be interpreted as the condition S=F. For the case C.Negated=True, C can be interpreted as the condition S!=F. In both cases, F is a formula for calculating a value of the same type as S. For example, if S is of Boolean type, then F is a Boolean formula returning either True or False. If, however, S is an arithmetic type (integer, floating point, etc.), then F is an arithmetic formula returning an arithmetic value.

At diamond 700, the invention determines whether C1.Signal=S or C2.Signal=S. If this condition is not met, then the sequence returns False as its result. Otherwise, diamond 720 is carried out.

At diamond 720, the invention determines whether C1.Signal=C2.Signal and C1.Formula=C2.Formula and C1.Negated!=C2.Negated. If this compound condition is met, then the sequence returns True as its result. Otherwise, diamond 740 is carried out.

At diamond 740, the invention determines whether C1.Formula is a set of values and C2.Formula is a set of values, each such set of values representing a disjunction, "OR", of those values as illustrated above in Resolve Examples 3 and 4 discussed in conjunction with FIG. 12. If the condition is met, then diamond 750 is carried out. Otherwise, diamond 810 is carried out.

At diamond 750, the invention determines whether C1.Signal=C2.Signal. If this condition is met, then box 770 is carried out. Otherwise, the sequence returns False as its result.

At box 770—and also at box 790—use is made of the "Complemented" data member of the "Formula" type. This data member, which is of type Bool, is used only when a Formula is a set of values and indicates whether that set is complemented. At box 770, C1.Formula.Complemented is negated—True is changed to False and False is changed to True—if C1.Negated is True; and C2.Formula.Complemented is negated if C2.Negated is True. Box 530 is then carried out.

At box 780, a temporary variable RESULT of type Bool is created and set equal to Resolvable(C1.Formula, C2.Fornula). The details of determining whether two sets of values—in this case, C1.Formula and C2.Formula—are "Resolvable" are described in further detail in conjunction with FIG. 17 below. Box 790 is then carried out.

At box 790, the effects of the actions of box 770 are reversed by performing the actions of box 770 a second time. As a result, the values of C1.Formula.Complemented and C2.Formula.Complemented are the same after box 790 is carried out as they were prior to carrying out box 770. Upon completion of box 790, the sequence returns the value of RESULT.

At diamond 810, the invention determines whether C1.Signal=S and C1.Negated holds (is true) and S appears in C2.Formula. If this compound condition is met, then the sequence returns True. Otherwise, diamond 820 is carried out.

Figure 17:
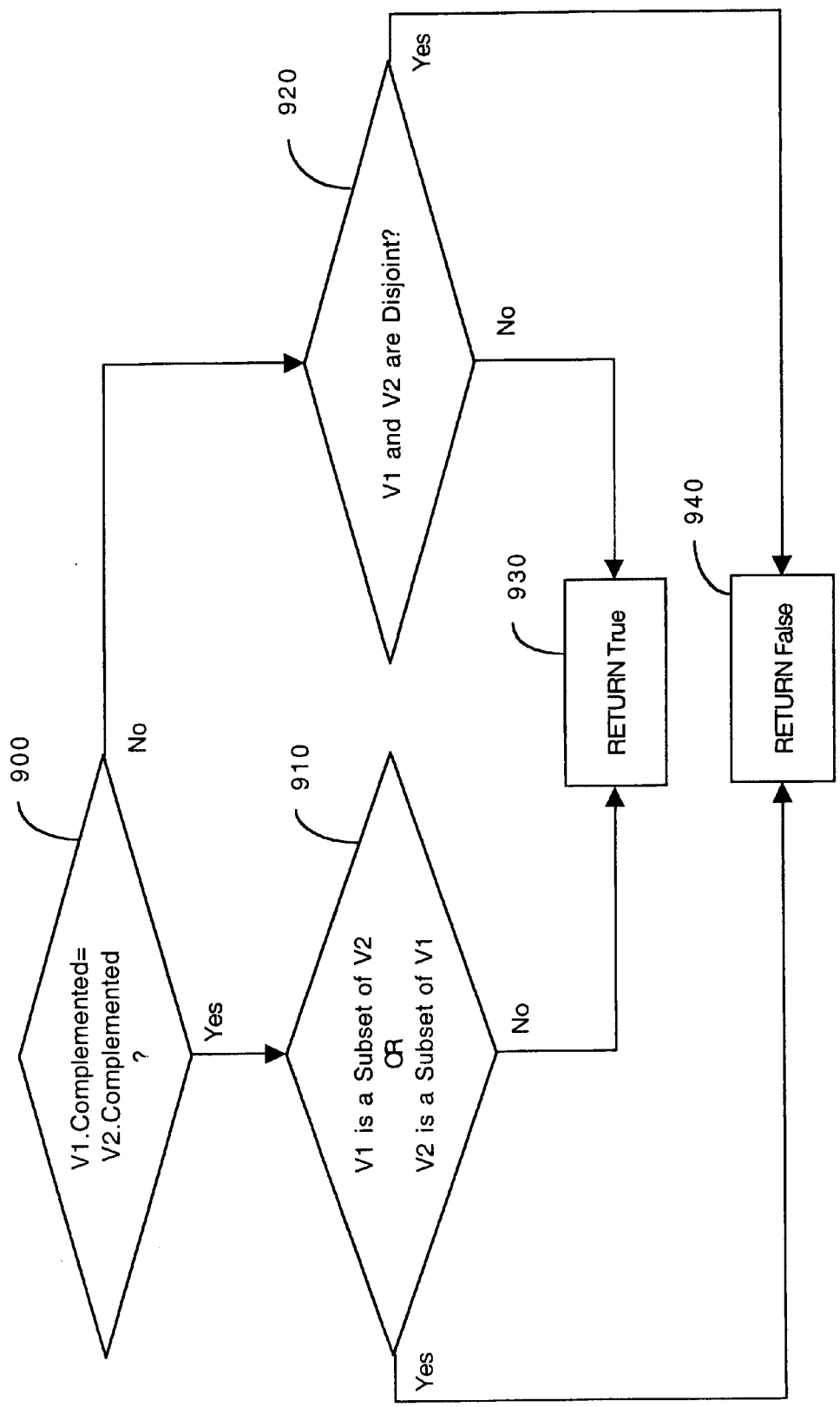
FIG. 17 is flow chart generally showing the acts associated with determining whether a first set of values V1 is resolvable with a second set of values V2.

At diamond 820, the invention determines whether C2.Signal=S and C2.Negated holds (is true) and S appears in C1.Formula. If this compound condition is met, then the sequence returns True. Otherwise, the sequence returns False. Referring now to FIG. 17, there is generally shown the acts associated with determining whether a set of values V1 and a set of values V2 are "Resolvable". This sequence is carried out as part of box 780 of FIG. 16 described above.

At diamond 900, the invention determines whether V1.Complemented=V2.Complemented. If this condition holds, then diamond 910 is carried out. Otherwise, diamond 920 is carried out.

At diamond 910, the invention determines whether the set of values V1 is a subset of the set of values V2 OR the set of values V2 is a subset of the set of values V1. If this compound condition holds, then the sequence returns False. Otherwise, the sequence returns True.

At diamond 920, the invention determines whether the set of values V1 and the set of values V2 are disjoint. If this condition holds, then the sequence returns False. Otherwise, the sequence returns True.

Figure 18:
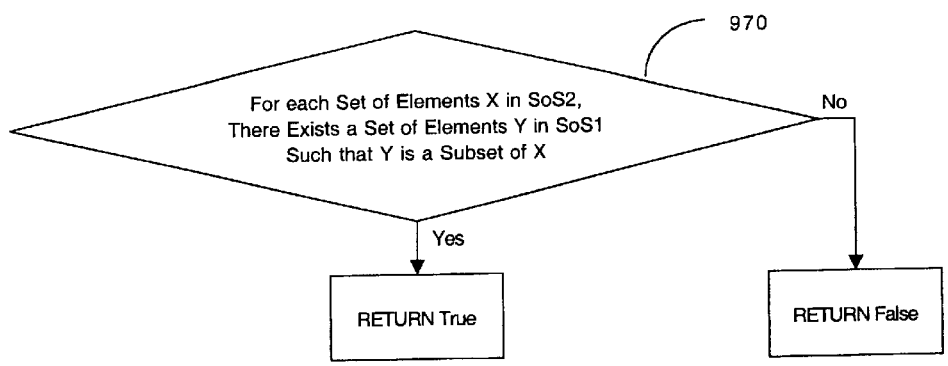
FIG. 18 is flow chart generally showing the acts associated with determining whether a first SetOfSets SoS1 covers a second SetofSets SoS2.

Referring now to FIG. 18, there is generally shown the acts associated with determining whether a set of sets SoS1 "Covers" a set of sets SoS2. This sequence is carried out as part of boxes 540 and 550 of FIG. 14 described above. At diamond 970, the invention determines whether for each set of elements X in SoS2, there exists a set of elements Y in SoS1 such that Y is a subset of X. If this condition holds, then the sequence returns True. Otherwise, the sequence returns False.

Figure 19:
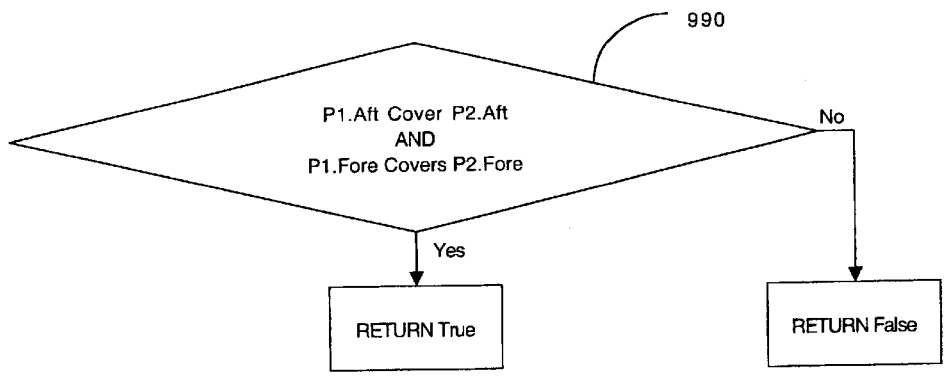
FIG. 19 is flow chart generally showing the acts associated with determining whether a first SetOfSetPairs P1 covers a second SetOfSetPairs P2.

Referring now to FIG. 19, there is generally shown the acts associated with determining whether an SOSPAIR P1 "Covers" an SOSPAIR P2. This sequence is carried out as part of boxes 520 and 550 of FIG. 14 described above At diamond 990, the invention determines whether P1.Aft Covers P2.Aft AND P1.Fore Covers P2.Fore. If this compound condition holds, then the sequence returns True. Otherwise, the sequence returns False.

Accordingly, it will be seen that this invention provides a system and method for verifying system behaviors using constraint calculus analysis. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. A method for verifying system behavior, comprising the computer-implemented steps of:
   (a) receiving a first constraint graph that includes at least one accepted path, each accepted path in said first constraint graph representing a known disallowed pattern of behavior of the system to be verified;
   (b) receiving a second constraint graph that includes at least one accepted path, each accepted path in said second constraint graph representing a conjectured disallowed pattern of behavior of the system to be verified; and
   (c) transforming paths in said second constraint graph to produce a third resultant and verified constraint graph, each accepted path in said third graph being implied by the first constraint graph and representing an accepted path in said second constraint graph.

2. The method of claim 1 wherein said transforming paths in said second constraint graph comprises:
   (d) creating a set of links from said first constraint graph;
   (e) resolving and deleting said created links via signals which are not mentioned in said second conjectured graph;
   (f) resolving links via signals that are mentioned in said conjectured constraint graph, and
   (g) normalizing said conjectured constraint graph using the links generated in acts (d) through (f).

3. A machine having a memory which contains data representing the third resultant and verified constraint graph generated by the method of claim 1.

4. A computer-readable medium carrying one or more sequences of instructions for verifying system behavior, wherein execution of the one or more sequences of instructions by one or more processors causes the one or more processors to perform the steps of:
   (a) receiving a first constraint graph that includes at least one accepted path, each accepted path in said first constraint graph presenting a known disallowed pattern of behavior of the system to be verified;
   (b) receiving a second constraint graph that includes at least one accepted path, each accepted path in said second constraint graph representing a conjectured disallowed pattern of behavior of the system to be verified; and
   (c) transforming paths in said second constraint graph to produce a third resultant and verified constraint graph, each accepted path in said third graph being implied by the first constraint graph and representing an accepted path in said second constraint graph.

5. The computer-readable medium of claim 4, wherein said transforming paths in said second constraint graph comprises:
   (d) creating a set of links from said first constraint graph;
   (e) resolving and deleting said created links via signals which are not mentioned in said second conjectured graph;
   (f) resolving links via signals that are mentioned in said conjectured constraint graph, and
   (g) normalizing said conjectured constraint graph using the links generated in acts (d) through (f).

6. A method for verifying system behavior comprising the computer-implemented steps of:
   (a) receiving a first constraint graph representing a set of known constraints, said first constraint graph including at least one path;
   (b) receiving a second constraint graph representing a set of conjectured constraints, said second constraint graph including at least one path; and
   (c) transforming said second constraint graph, or a copy thereof, by performing steps that include
      (c.1) associating with each node N of the graph being transformed a data structure N.Struct1 representing a set of sets of nodes of said first constraint graph;
      (c.2) for an arc A of the graph being transformed, updating an endpoint of arc A by calculating a data structure X representing a set of sets of nodes of said first constraint graph, and either setting M.Struct1 equal to X, wherein M is the node attached to said endpoint, or moving said endpoint to another node N having the property that N.Struct1=X; and
      (c.3) storing data structure X within a memory.

7. The method of claim 6 wherein the endpoint of arc A updated in Step c.2 is the head of arc A.

8. The method of claim 6 wherein the endpoint of arc A updated in Step c.2 is the tail of arc A.

9. The method of claim 6 wherein Step c.1 further includes:
   associating with each node N of the graph being transformed a data structure N.Struct2 representing a set of sets of nodes of said first constraint graph;
   wherein if M.Struct1 is set equal to X in Step c.2, then M.Struct2 is set equal to a data structure representing the inverse of the set of sets of nodes of said first constraint graph represented by M.Struct1; and
   wherein the data structure X in Step c.2 is derived from (1) said first constraint graph, (2) A.BooleanFormula and (3) P.Struct2, wherein P is the node attached to the endpoint of arc A opposite to the endpoint currently being updated.

10. The method of claim 9 wherein the endpoint of arc A updated in Step c.2 is the head of arc A.

11. The method of claim 10 wherein for each initial node N of the graph being transformed, N.Struct2 represents the set containing the null set.

12. The method of claim 11 wherein Step c.2 is repeated until the heads of all arcs have been updated.

13. The method of claim 12 wherein nodes and arcs of the graph being transformed that are not on a path from an initial node to a node N having the property that N.Struct1 represents the set containing the null set are deleted.

14. The method of claim 9 wherein the endpoint of arc A updated in Step c.2 is the tail of arc A.

15. The method of claim 14 wherein for each terminal node N of the graph being transformed, N.Struct2 represents the set containing the null set.

16. The method of claim 15 wherein Step c.2 is repeated until the tails of all arcs have been updated.

17. The method of claim 16 wherein nodes and arcs of the graph being transformed that are not on a path from a node N having the property that N.Struct1 represents the set containing the null set to a terminal node are deleted.

18. A machine having a memory which contains data representing the third resultant and verified constraint graph generated by the method of claim 6.

19. A computer system, comprising:

a memory;

one or more processors;

said computer system configured to perform the steps of:

receiving a first constraint graph that includes at least one accepted path, each accepted path in said first constraint graph representing a known disallowed pattern of behavior of the system to be verified;

receiving a second constraint graph that includes at least one accepted path, each accepted path in said second constraint graph representing a conjectured disallowed pattern of behavior of the system to be verified;

transforming paths in said second constraint graph to produce a third resultant and verified constraint graph, each accepted path in said third graph being implied by the first constraint graph and representing an accepted path in said second constraint graph; and storing data representing at least a portion of said third resultant and verified constraint graph in said memory.

* * * * *